US010989952B2

(12) United States Patent
Katsuta

(10) Patent No.: US 10,989,952 B2
(45) Date of Patent: Apr. 27, 2021

(54) DISPLAY DEVICE

(71) Applicant: Japan Display Inc., Minato-ku (JP)

(72) Inventor: Tadayoshi Katsuta, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/519,262

(22) Filed: Jul. 23, 2019

(65) Prior Publication Data

US 2019/0346715 A1 Nov. 14, 2019

Related U.S. Application Data

(63) Continuation of application No. 15/697,558, filed on Sep. 7, 2017, now Pat. No. 10,409,103.

(30) Foreign Application Priority Data

Sep. 8, 2016 (JP) .............................. JP2016-175216
Sep. 8, 2016 (JP) .............................. JP2016-175217

(51) Int. Cl.
*G02F 1/1345* (2006.01)
*G02F 1/1335* (2006.01)
(Continued)

(52) U.S. Cl.
CPC ...... *G02F 1/133512* (2013.01); *G02F 1/1345* (2013.01); *H01L 27/3295* (2013.01);
(Continued)

(58) Field of Classification Search
CPC ............ G02F 1/133512; G02F 1/1345; G02F 2201/44; G02F 2201/56; G02F 1/136286;
(Continued)

(56) References Cited

U.S. PATENT DOCUMENTS 8,159,644 B2 * 4/2012 Takatori ................... G09G 3/20
349/146
9,633,594 B2 * 4/2017 Yang ..................... G06F 1/1637
(Continued)

FOREIGN PATENT DOCUMENTS

CN 101295081 A 10/2008
JP 2008-292995 12/2008
JP 2009-122636 6/2009

OTHER PUBLICATIONS

Combined Chinese Office Action and Search Report dated Jul. 2, 2020 in corresponding Chinese Patent Application No. 201710787705.6 (with English Translation and English Translation of Category of Cited Documents) citing document AO therein, 11 pages.

*Primary Examiner* — Jose R Soto Lopez
(74) *Attorney, Agent, or Firm* — Oblon, McClelland, Maier & Neustadt, L.L.P.

(57) ABSTRACT

A display device includes a display region, a peripheral region outside the display region, a control circuit, driving circuits, a clock line connecting the control circuit to one of the driving circuits and in which a first clock signal is supplied, and another clock line connecting the control circuit to the other of the driving circuits and in which a second clock signal is supplied. A light shielding layer includes extension portions each extending along a Y direction, and bent portions between the extension portions. A length of one of the extension portions is longer than a length of the other of the extension portions. In plan view, one of the bent portions overlaps with one of the clock lines, and the other of the bent portions is located between termination portions of the clock lines.

13 Claims, 19 Drawing Sheets

(51) Int. Cl.
  *H01L 27/32* (2006.01)
  *G02F 1/1362* (2006.01)
(52) U.S. Cl.
  CPC .... *H01L 27/3297* (2013.01); *G02F 1/136286* (2013.01); *G02F 2201/44* (2013.01); *G02F 2201/56* (2013.01)
(58) Field of Classification Search
  CPC ........... G02F 1/13306; G02F 1/136209; H01L 27/3295; H01L 27/3297; H01L 27/3276; H01L 27/3246; H01L 27/3279
  See application file for complete search history.

(56) References Cited

U.S. PATENT DOCUMENTS

| | | | | |
|---|---|---|---|---|
| 9,887,256 | B2* | 2/2018 | Kim | H01L 27/3265 |
| 2002/0075440 | A1* | 6/2002 | Deane | G02F 1/1345 349/149 |
| 2003/0076458 | A1* | 4/2003 | Matsushima | G02F 1/136209 349/110 |
| 2006/0077191 | A1* | 4/2006 | Ming-Daw | G02F 1/133351 345/204 |
| 2008/0012794 | A1* | 1/2008 | Battersby | G02F 1/1345 345/55 |
| 2008/0018557 | A1* | 1/2008 | Maeda | G02F 1/167 345/55 |
| 2008/0018583 | A1* | 1/2008 | Knapp | G02F 1/134309 345/99 |
| 2008/0048934 | A1* | 2/2008 | Yamamoto | G09G 3/3611 345/55 |
| 2008/0088568 | A1* | 4/2008 | Haga | G09G 3/18 345/100 |
| 2008/0158124 | A1* | 7/2008 | Kim | G09G 3/3648 345/92 |
| 2008/0266210 | A1* | 10/2008 | Nonaka | G11C 19/28 345/55 |
| 2009/0102758 | A1* | 4/2009 | Anzai | G09G 3/2096 345/76 |
| 2009/0115933 | A1* | 5/2009 | Mimura | G02F 1/133606 349/59 |
| 2009/0121984 | A1* | 5/2009 | Yamamoto | G09G 3/3266 345/76 |
| 2009/0189835 | A1* | 7/2009 | Kim | G09G 3/3677 345/80 |
| 2009/0195721 | A1* | 8/2009 | Tanahara | G02F 1/136213 349/39 |
| 2010/0020277 | A1* | 1/2010 | Morita | G02F 1/136209 349/110 |
| 2010/0134743 | A1* | 6/2010 | Shin | G09G 3/20 349/143 |
| 2010/0141570 | A1* | 6/2010 | Horiuchi | G09G 3/3611 345/100 |
| 2010/0156945 | A1* | 6/2010 | Yoshida | G02F 1/1345 345/690 |
| 2010/0289994 | A1* | 11/2010 | Nonaka | G09G 3/20 349/108 |
| 2013/0057459 | A1* | 3/2013 | Kuo | G02F 1/136286 345/84 |
| 2014/0001253 | A1* | 1/2014 | Smith | G06Q 20/3276 235/375 |
| 2014/0028961 | A1* | 1/2014 | Yanagisawa | G02F 1/13439 349/106 |
| 2014/0078027 | A1 | 3/2014 | Noh | |
| 2014/0159204 | A1* | 6/2014 | Ma | G02F 1/13452 257/536 |
| 2014/0253419 | A1* | 9/2014 | Tanada | G09G 3/20 345/55 |
| 2015/0228702 | A1* | 8/2015 | Lee | G09G 3/3611 257/40 |
| 2015/0301266 | A1* | 10/2015 | Araki | G02B 6/0088 349/65 |
| 2015/0355487 | A1* | 12/2015 | Emmert | G02F 1/13454 349/33 |
| 2016/0019856 | A1* | 1/2016 | Tanaka | G09G 3/3677 345/206 |
| 2016/0054971 | A1* | 2/2016 | Yu | H04N 7/15 345/2.1 |
| 2016/0086362 | A1* | 3/2016 | Suzuki | G06T 11/206 345/440 |
| 2016/0113106 | A1* | 4/2016 | Kim | G02F 1/1333 361/749 |
| 2016/0131946 | A1* | 5/2016 | Kim | G02F 1/133711 349/130 |
| 2016/0189664 | A1* | 6/2016 | Lee | H01L 27/124 345/208 |
| 2016/0190166 | A1* | 6/2016 | Kim | G09G 3/3233 257/71 |
| 2016/0210893 | A1* | 7/2016 | Lee | G06F 1/163 |
| 2016/0232837 | A1* | 8/2016 | Lee | G09G 3/3275 |
| 2016/0240141 | A1* | 8/2016 | Lee | G02F 1/13454 |
| 2016/0286164 | A1* | 9/2016 | Kratz | G06T 7/246 |
| 2016/0320920 | A1* | 11/2016 | Morris | G06F 3/0416 |
| 2016/0329350 | A1* | 11/2016 | Na | G09G 3/00 |
| 2016/0335982 | A1* | 11/2016 | Park | G09G 3/20 |
| 2016/0351107 | A1* | 12/2016 | Chen | G09G 3/20 |
| 2017/0003541 | A1* | 1/2017 | Xu | G02F 1/13454 |
| 2017/0110479 | A1* | 4/2017 | Chen | G02F 1/136204 |
| 2017/0162093 | A1* | 6/2017 | Kang | G09G 3/006 |
| 2017/0200426 | A1* | 7/2017 | Li | G09G 3/001 |
| 2017/0309689 | A1* | 10/2017 | Li | H01L 51/5246 |
| 2017/0322446 | A1* | 11/2017 | Tae | G02F 1/134309 |
| 2018/0067356 | A1* | 3/2018 | Katsuta | H01L 27/3276 |
| 2018/0240377 | A1* | 8/2018 | Xu | G02F 1/13306 |

* cited by examiner

DISPLAY DEVICE

CROSS-REFERENCE TO RELATED APPLICATION

The application is a continuation of and claims the benefit of priority under 35 U.S.C. § 120 from U.S. application Ser. No. 15/697,558 filed Sep. 7, 2017, and claims the benefit of priority under 35 U.S.C. § 119 from Japanese Patent Application Nos. 2016-175216 filed Sep. 8, 2016 and No. 2016-175217 filed Sep. 8, 2016, the contents of each of which are incorporated herein by reference.

TECHNICAL FIELD OF THE INVENTION

The present invention relates to a display device.

BACKGROUND OF THE INVENTION

A display device generally has a rectangular external shape. In recent years, however, with expansion of fields of application of the display device, there is also a display device having a shape other than a rectangle. Such display device is disclosed, for example, in Japanese Patent Application Laid-Open Publication No. 2009-122636 (Patent Document 1) and Japanese Patent Application Laid-Open Publication No. 2008-292995 (Patent Document 2).

SUMMARY OF THE INVENTION

In a display region of a display device, there are a plurality of electrodes driving an electro-optical layer, and a signal line supplying a driving signal and a scanning signal to the plurality of electrodes. In a peripheral region around the display region, a circuit supplying a signal to the above-described plurality of electrodes is disposed. In a case where a shape of the display region or a shape of an outer edge portion of the peripheral region is a shape other than a rectangle or a square, a problem may arise due to the shape of the display region or the peripheral region. In the present specification, the shape other than the rectangle or the square may be referred to as an "irregular shape" hereinafter.

For example, in a case where each length of a plurality of signal lines is different from each other due to the display region having the irregular shape, in-plane distribution of a load given to each of the signal lines becomes uneven. When the in-plane distribution of the load given to each of the signal lines becomes uneven in this way, it may cause deterioration of image quality.

Also, when each of the plurality of signal lines is made to have the same length, it is necessary to make an external shape of the peripheral region a rectangle. In this case, an area occupied by the display region in the display device is reduced.

An object of the present invention is to provide a technique for improving performance of a display device.

The typical ones of the inventions disclosed in the present application will be briefly described as follows.

A display device as one aspect of the present invention includes: a display region in which first pixels are arrayed; a peripheral region overlapping with a light shielding layer and being outside the display region; a plurality of scanning signal line and a plurality of video signal lines within the display region; a first control circuit supplying a control signal including a clock signal; a first driving circuit and a second driving circuit supplying a scanning signal; a first clock line connecting the first control circuit to the first driving circuit and in which a first clock signal is supplied; and a second clock line connecting the first control circuit to the second driving circuit and in which a second clock signal is supplied. Also, the plurality of video signal lines extend in a first direction. The light shielding layer includes a first extension portion and a second extension portion each extending along the first direction and includes a first bent portion and a second bent portion located between the first extension portion and the second extension portion. The first extension portion is connected to the first bent portion, and the second extension portion is connected to the second bent portion. A length of the second extension portion is longer than a length of the first extension portion. Also, in plan view, the first bent portion overlaps with the first clock line, and the second bent portion is located between a termination portion of the first clock line and a termination portion of the second clock line.

BRIEF DESCRIPTIONS OF THE DRAWINGS

Figure 3:
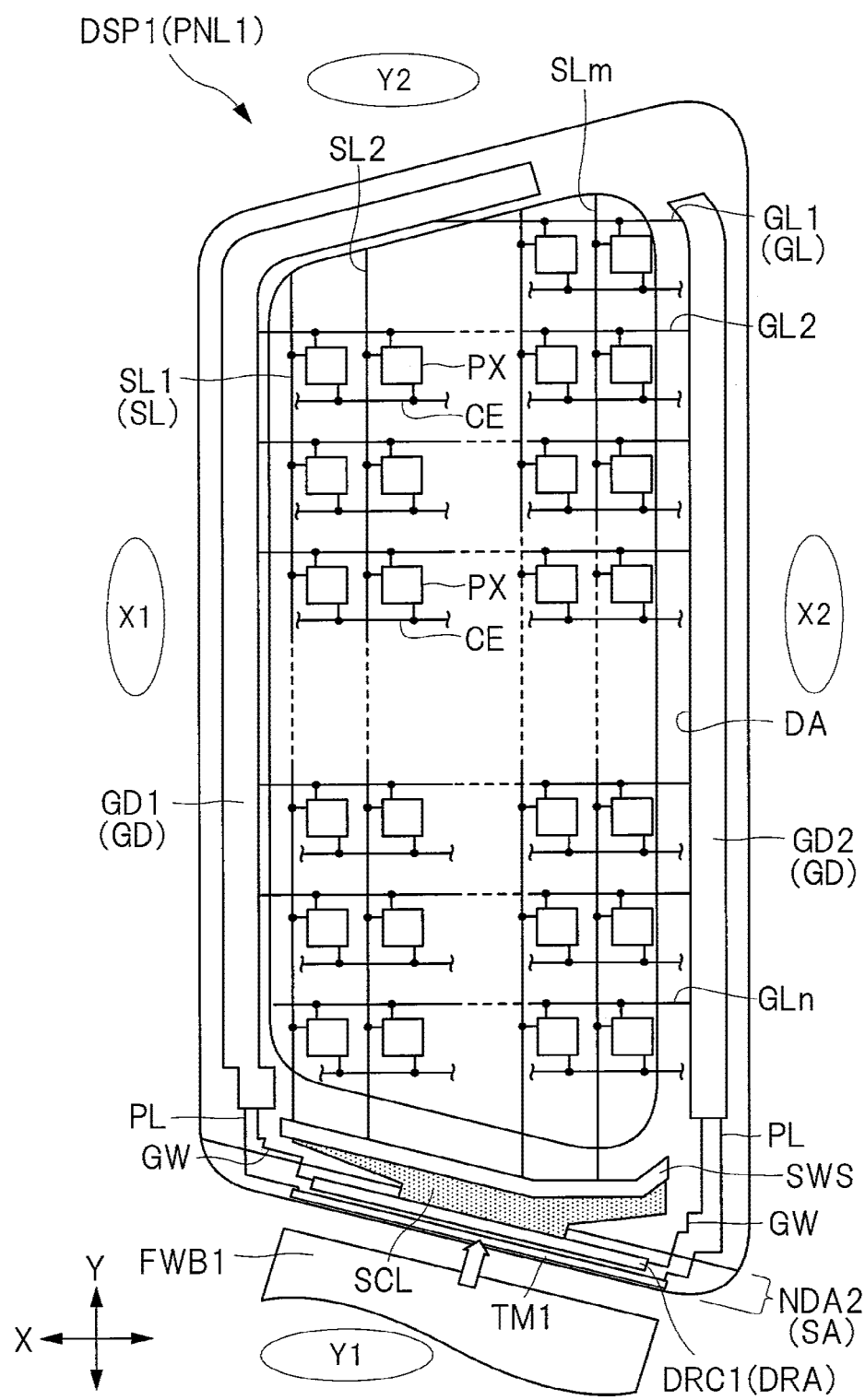
FIG. 3 is a plan view illustrating an exemplary arrangement of a common electrode in the display device illustrated in FIG. 1.
Figure 22:
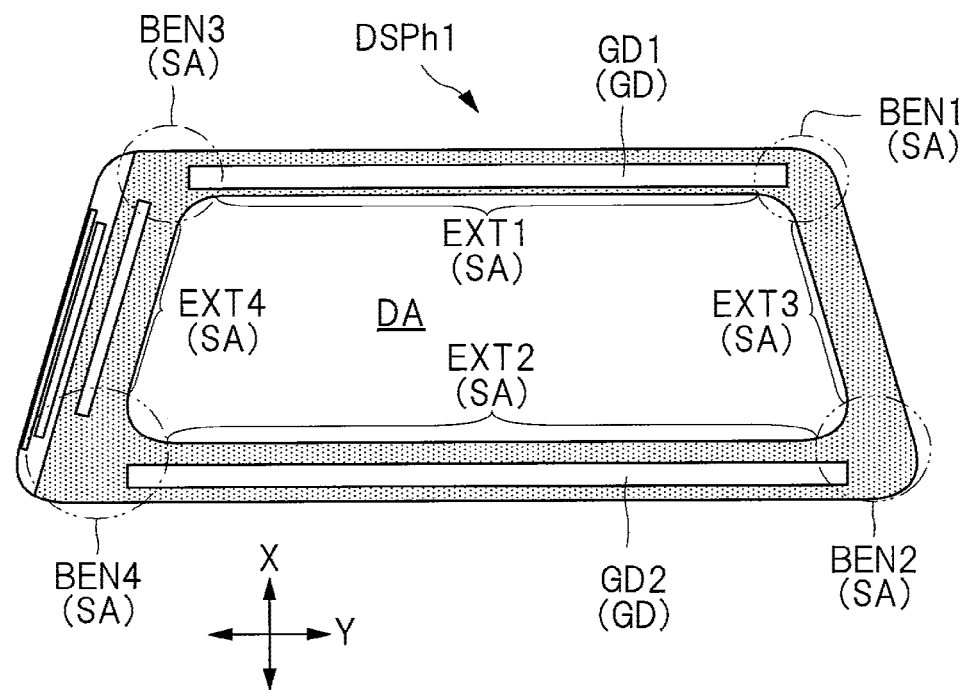
Figure 23:
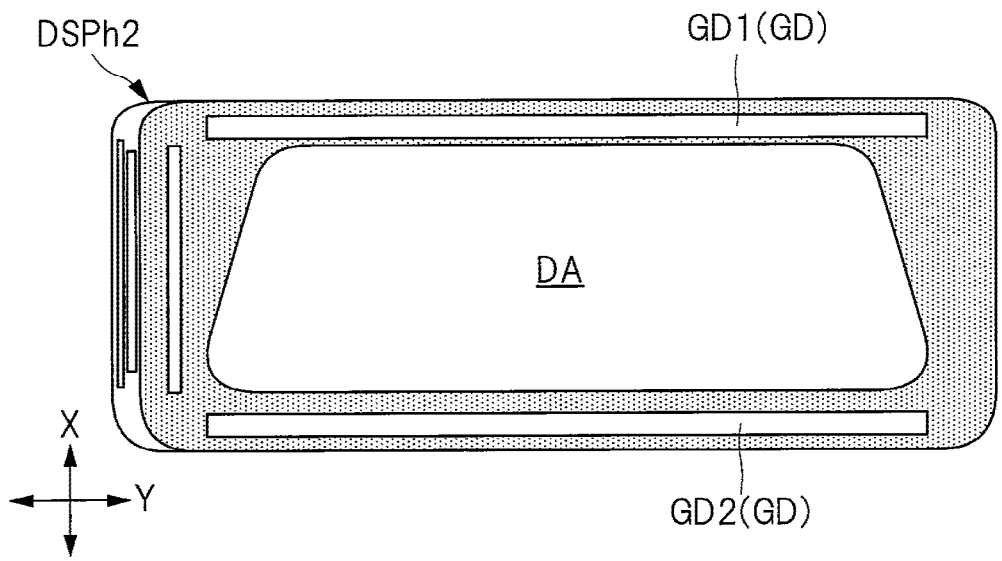

FIG. 22 is an explanatory drawing illustrating an exemplary layout of a scanning signal line driving circuit of a display device that is a study example of the display device illustrated in FIG. 3; and FIG. 23 is an explanatory drawing illustrating an exemplary layout of a scanning signal line driving circuit of a display device that is another study example of the display device illustrated in FIG. 3.

DESCRIPTIONS OF THE PREFERRED EMBODIMENTS

Hereinafter, embodiments of the present invention will be described with reference to the drawings.

Note that this disclosure is an example only and suitable modifications which can be easily conceived by those skilled in the art without departing from the gist of the present invention are included within the scope of the invention as a matter of course. In addition, in order to further clarify the description, a width, a thickness, a shape, and the like of respective portions may be schematically illustrated in the drawings as compared to aspects of the embodiments, but they are examples only and do not limit the interpretation of the present invention.

In addition, in this specification and the respective drawings, the same components described in the drawings which have been described before are denoted by the same reference characters, and detailed description thereof may be omitted as needed.

Further, hatching which is applied in order to distinguish a structure is sometimes omitted in the drawings used in the embodiments depending on the drawing.

Also, a technique described in an embodiment below is widely applicable to a display device provided with a mechanism in which a signal from a periphery of a display region is supplied to a plurality of elements in the display region provided with an electro-optical layer. The electro-optical layer is a layer provided with an element having a function of forming a display image and being driven by an electric control signal. Various display devices may be exemplified as the above-described display device such as a liquid crystal display device, an organic electro-luminescence (EL) display device, and a plasma display device, for example. In the embodiment below, the liquid crystal display device is selected and described as a typical example of the display device.

The liquid crystal display device is roughly classified into the following two, depending on a direction of applying an electric field for changing alignment of a liquid crystal molecule in a liquid crystal layer serving as a liquid crystal functional layer. That is, as a first category, there is a so-called vertical electric field mode in which the electric field is applied in a thickness direction (or an out-of-plane direction) of the display device. In the vertical electric field mode, for example, there are a twisted nematic (TN) mode, a vertical alignment (VA) mode, and the like. As a second category, there is a so-called horizontal electric field mode in which the electric field is applied in a plane direction (or an in-plane direction) of the display device. In the horizontal electric field mode, for example, there are an in-plane switching (IPS) mode, a fringe field switching (FFS) mode which is one of the IPS modes, and the like. Although the technique described below is applicable to any of the vertical electric field mode and the horizontal electric field mode, a display device of the horizontal electric field mode will be described in the embodiment below, by way of example.

<Configuration of Display Device>

Figure 1:
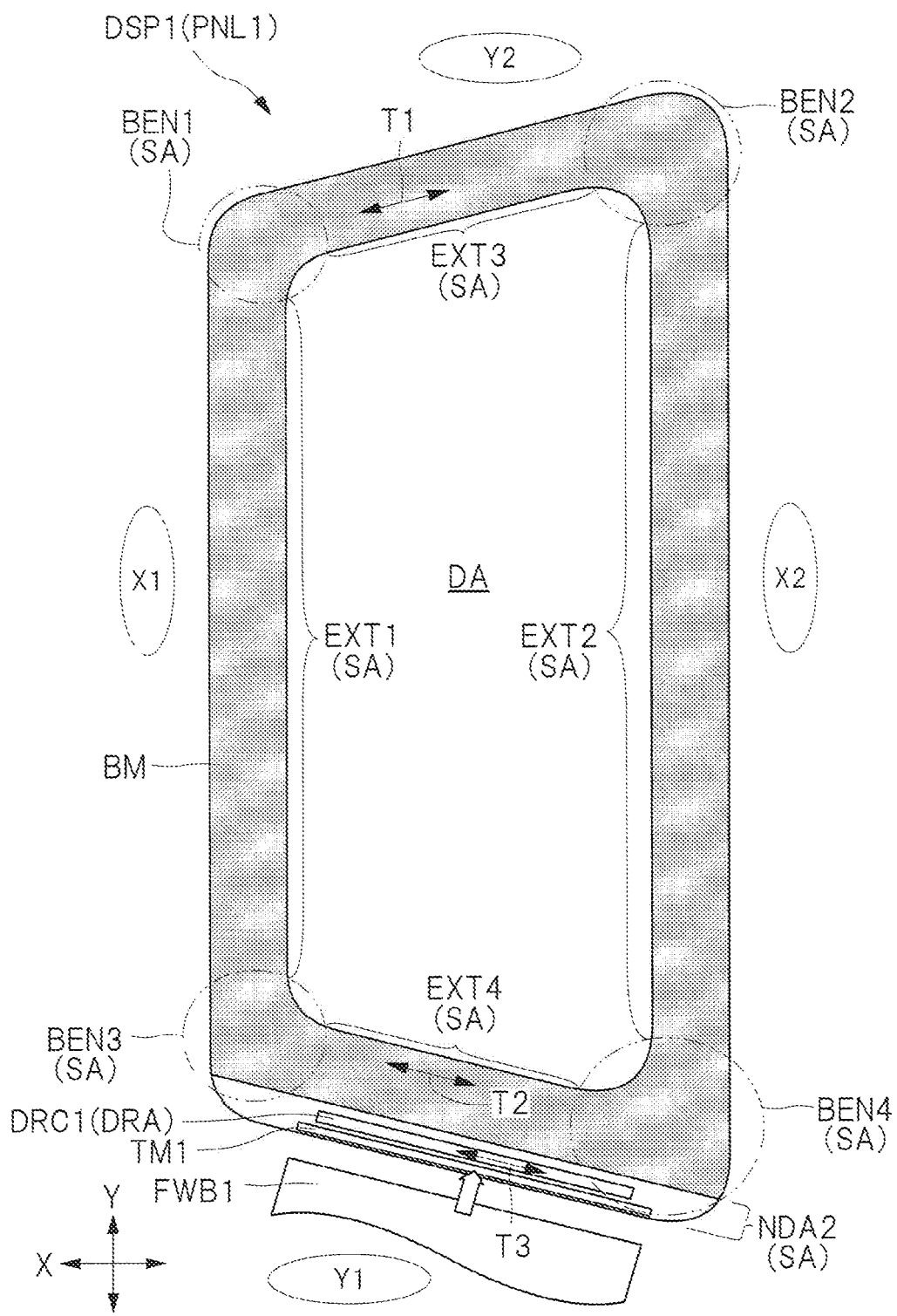
FIG. 1 is a plan view illustrating one exemplary configuration of a display device according to one embodiment.
Figure 2:
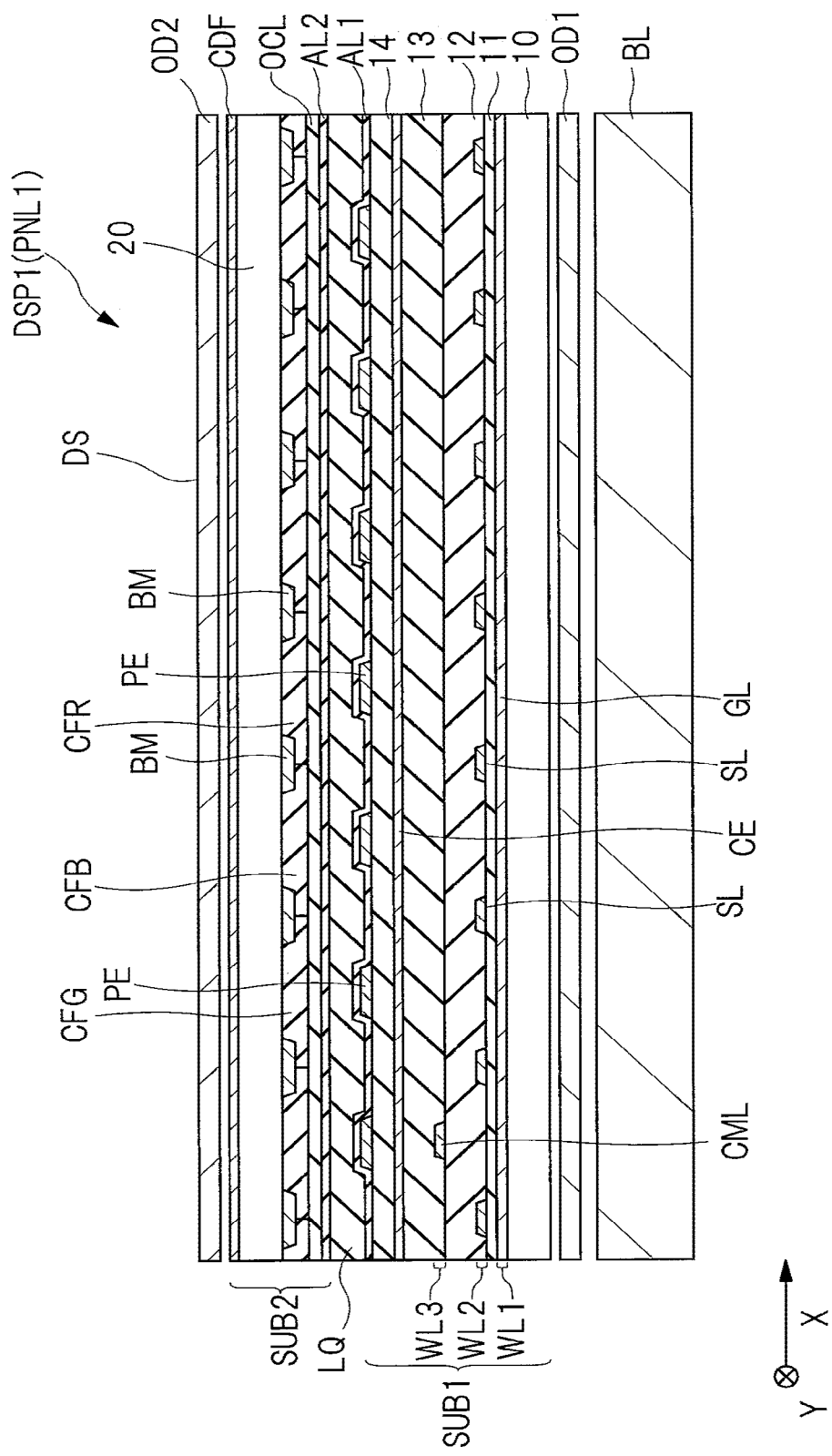
FIG. 2 is an enlarged cross-sectional view illustrating a part of a display region of the display device illustrated in FIG. 1.
Figure 4:
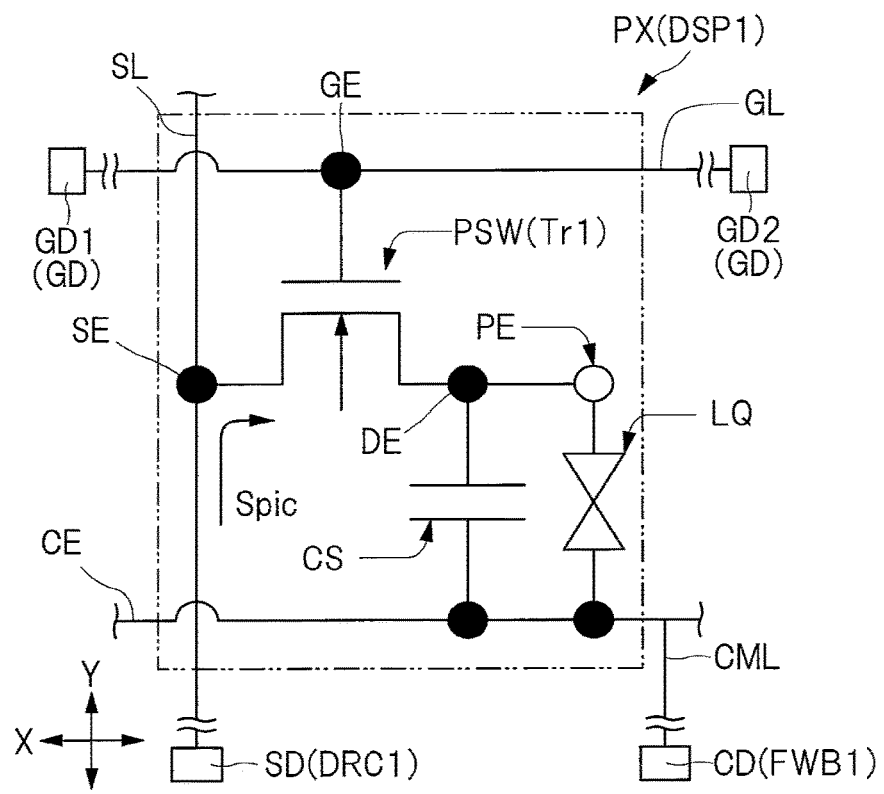
FIG. 4 is an equivalent circuit diagram illustrating a pixel in the display device illustrated in FIG. 1.
Figure 5:
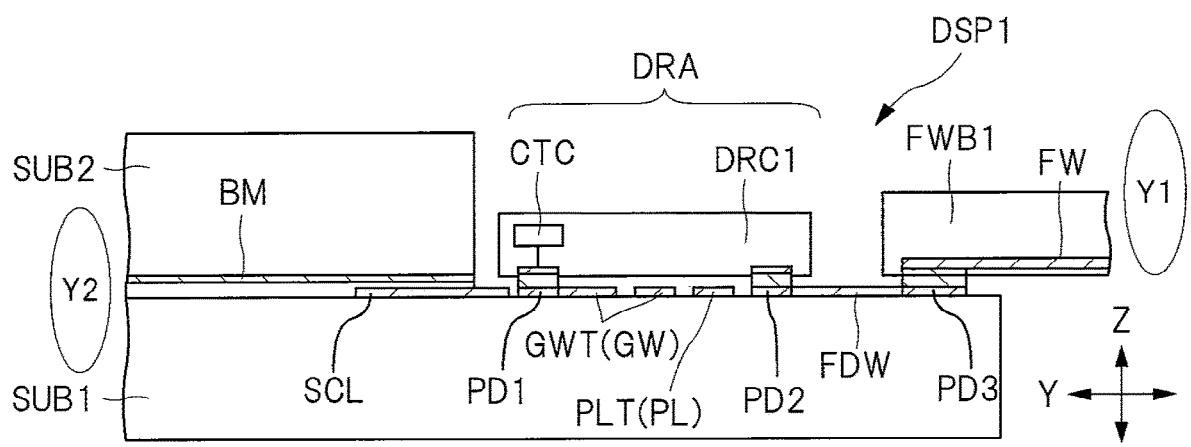
FIG. 5 is an enlarged cross-sectional view illustrating a connecting part between a driver chip and a substrate illustrated in FIG. 1.
Figure 6:
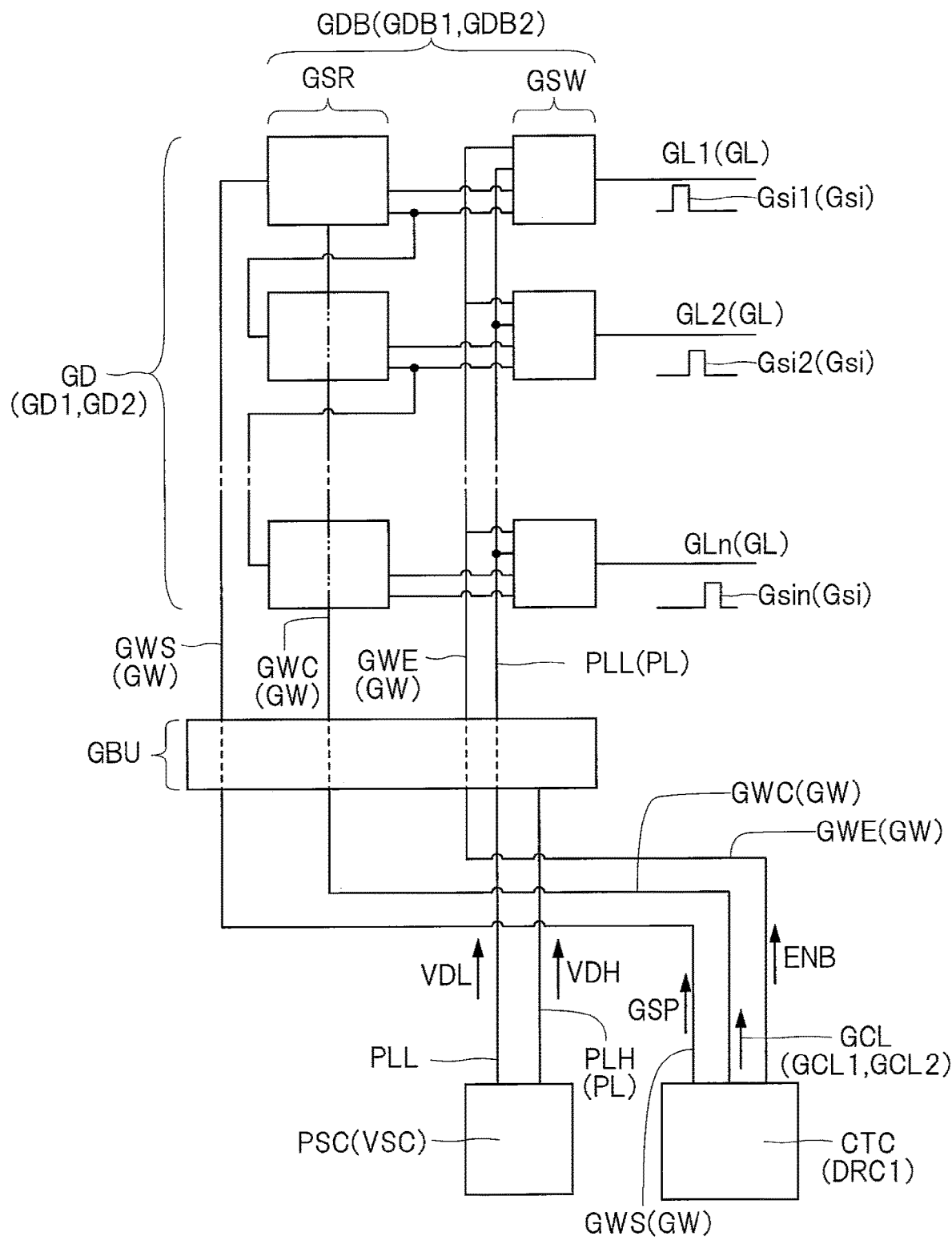
FIG. 6 is a circuit block diagram illustrating an exemplary configuration of a scanning signal line driving circuit illustrated in FIG. 1.

FIG. 1 is a plan view illustrating one exemplary configuration of a display device according to one embodiment. FIG. 2 is an enlarged cross-sectional view illustrating a part of a display region of the display device illustrated in FIG. 1. FIG. 3 is a plan view illustrating an exemplary circuit layout in the display device illustrated in FIG. 1. FIG. 4 is an equivalent circuit diagram illustrating a pixel in the display device illustrated in FIG. 3. FIG. 5 is an enlarged cross-sectional view illustrating a connecting part between a driver chip and a substrate illustrated in FIG. 1. FIG. 6 is a circuit block diagram illustrating an exemplary configuration of a scanning signal line driving circuit illustrated in FIG. 1. Note that, in FIG. 1, a part of a peripheral region SA overlapping with a light shielding layer BM is indicated with a pattern having a darker color than that of a display region DA. Also, in FIG. 2, to illustrate an exemplary positional relation between a scanning signal line GL and a video signal line SL in a thickness direction of a substrate SUB1, the scanning signal line GL, which is provided to a cross-section different from FIG. 2, is also illustrated. Also, to a switching circuit SWS illustrated in FIG. 3, a large number of video signal connecting lines SCL are connected, and in FIG. 3, a region in which a large number of video signal connecting lines SCLs are arranged is indicated with a dotted pattern.

As illustrated in FIG. 1, a display device DSP1 includes a display panel PNL1 and a driver chip DRC1 mounted on the display panel PNL1. The display panel PNL1 has a display surface DS (see FIG. 2) on which an image is displayed. The driver chip DRC1 is an integrated circuit (IC) chip provided with a control circuit for controlling driving of the display panel PNL1. The display device DSP1 also includes a wiring board (wiring portion) FWB1, which is a wiring member connected to the display panel PNL1. The wiring board FWB1 is a flexible wiring board having a plurality of wirings covered with resin. The wiring board FWB1 is connected to a terminal portion TM1 of the display panel PNL1 as schematically illustrated with an arrow in FIG. 1. To the terminal portion TM1, not only an electric signal such as a driving signal and a video signal but also a power supply voltage for driving the display panel PNL1 is supplied from an external circuit of the display panel PNL1 via the wiring board FWB1.

Also, the display panel PNL1 is provided with the display region DA, in which a plurality of pixels (first pixels) PX (see FIG. 3) are arrayed, and the peripheral region SA outside the display region DA. The display region DA is a region in which an image visible from a display surface DS (see FIG. 2) side is displayed based on a signal input into the display device DSP1. In plan view, the peripheral region SA is disposed so as to continuously surround a periphery of the display region DA. In plan view, a side (end) on an inner side of the peripheral region SA is in contact with an outer edge portion of the display region DA. In the display region DA, the plurality of pixels PX are arrayed. For example, as illustrated in FIG. 3, in plan view, two directions crossing each other, preferably orthogonal to each other, are referred to as an X direction and a Y direction. In plan view, the plurality of pixels PX are arrayed in the X direction and the Y direction in a matrix within the display region DA. Note that, in the present application, "in plan view" means a view viewed from a direction perpendicular to the display surface of the display panel PNL1.

Also, the peripheral region SA is a non-display region in which the image, which is visible from outside, is not displayed and is disposed so as to surround the periphery of the display region DA. The peripheral region SA is the non-display region, and most of the peripheral region SA overlaps with the light shielding layer BM.

Also, as illustrated in FIG. 2, the display panel PNL1 includes the substrate SUB1, a substrate SUB2 disposed facing the substrate SUB1, and a liquid crystal layer LQ serving as an electro-optical layer disposed between the substrate SUB1 and the substrate SUB2. In other words, the display device DSP1 according to this embodiment is a liquid crystal display device provided with the liquid crystal layer LQ serving as the electro-optical layer. In other words, note that the substrate SUB1 is an array substrate, and the substrate SUB2 is a counter substrate in this embodiment.

As illustrated in FIG. 1, the driver chip DRC1 and the terminal portion TM1 are in a region (exposed region) NDA2 not overlapping with the light shielding layer BM, of the peripheral region SA of the display panel PNL1. When one side in the Y direction illustrated in FIG. 1 is referred to as a Y1 side and the other side therein is referred to as a Y2 side, the region NDA2 is on the Y1 side of the display region DA in the Y direction. As illustrated in FIG. 2, in the display panel PNL1, the substrate SUB1 and the substrate SUB2 face each other in the most part in plan view. However, the region NDA2 illustrated in FIG. 1 is exposed from the substrate SUB2 (see FIG. 5). In an example illustrated in FIG. 5, the light shielding layer BM is formed in the substrate SUB2, and the region NDA2 (see FIG. 1) does not overlap with the light shielding layer BM. Note that the light shielding layer BM is also disposed within the display region DA in addition to the peripheral region SA. In plan view, the light shielding layer BM is provided so as to surround a periphery of each of the plurality of pixels PX in the display region DA (see FIG. 3).

The driver chip DRC1 is mounted in a region DRA in the peripheral region SA (more specifically, the region NDA2). As illustrated in FIG. 5, in the region DRA of the substrate SUB1, a terminal PD1 and a terminal PD2 are disposed, and the driver chip DRC1 is connected to the terminal PD1 and the terminal PD2. The terminal PD1 is an interface electrically connecting a circuit formed in the driver chip DRC1 to a circuit formed in the display panel PNL1 (see FIG. 1). Also, the terminal PD2 is an interface electrically connecting the driver chip DRC1 with the wiring board FWB1. The driver chip DRC1 is connected with a terminal PD3 via the terminal PD2 and a wiring FDW. Also, to the terminal PD3, a wiring FW of the wiring board FWB1 is connected. Also, as illustrated in FIG. 1, at least a part of the driver chip DRC1 (for example, a long side) extends along a direction T3 that is inclined relative to each of the Y direction and the X direction.

As illustrated in FIG. 4, the display device DSP1 has a video signal line driving circuit SD. The video signal line driving circuit SD is electrically connected to a pixel PX to drive the liquid crystal layer LQ serving as the electro-optical layer via the video signal line SL. In the example of this embodiment, the video signal line driving circuit SD is formed in the driver chip DRC1. The video signal line driving circuit SD supplies a video signal Spic to a pixel electrode (first electrode) PE provided to each of the plurality of pixels PX via the video signal line SL. Also, as illustrated in FIG. 6, the driver chip DRC1 includes a control circuit (first control circuit) CTC supplying a control signal to a driving circuit via a control wiring GW. The control circuit CTC is electrically connected to the driving circuit via the terminal PD1 (see FIG. 5).

In this embodiment, as illustrated in FIG. 5, there is described an example in which the driver chip DRC1 is mounted on the substrate SUB1. Note that there are various modifications of a position of the driver chip DRC1 and a position of the control circuit CTC besides those in the region DRA illustrated in FIG. 1. For example, the driver chip DRC1 may also be mounted on the wiring board FWB1. In such case, the wiring board FWB1 is connected to the terminal PD1. Accordingly, even in a case where the driver chip DRC1 is mounted on the wiring board FWB1, the control circuit CTC of the driver chip DRC1 is electrically connected to the driving circuit via the terminal PD1 in the region DRA.

As illustrated in FIG. 3, the display device DSP1 includes a plurality of video signal lines SL and a plurality of pixels PX. In the display region DA, the plurality of pixels PX are arranged between the substrate SUB1 and the substrate SUB2 (see FIG. 2). The plurality of pixels PX are arrayed in the X direction and the Y direction in a matrix and arranged m by n (when m and n are positive integers). Each of the plurality of video signal lines SL extends in the Y direction and is arrayed in the X direction at an interval from each other. Each of the plurality of pixels PX is partitioned by the video signal lines SL in the X direction. Accordingly, the number of the pixels PX arrayed along the X direction corresponds to the number of the video signal lines SL. In the example illustrated in FIG. 3, m video signal lines SL are arrayed in an order of video signal lines SL1, SL2, and SLm, from X1 which is one side in the X direction, toward X2 which is the other side therein. Each of the plurality of video signal lines SL is drawn out to the peripheral region SA outside the display region DA. Each of the plurality of video signal lines SL is electrically connected with the driver chip DRC1 via the video signal connecting lines SCL as connecting wirings (also referred to as lead-out wirings) interconnecting the video signal lines SL within the display region DA and the driver chip DRC1.

The video signal lines SL and the video signal connecting lines SCL are video lines functioning as wirings transmitting a video signal, and the video signal lines SL and the video signal connecting lines SCL can be distinguished from each other as follows. That is, of the video line serving as a signal transmission path connected to the driver chip DRC1 and supplying the video signal to the plurality of pixels PX, apart (wiring portion) thereof in a position overlapping with the display region DA is referred to as the video signal lines SL. A part (wiring portion) of the above-described video lines outside the display region DA is referred to as the video signal connecting lines SCL (or as a lead-out wiring). Each of the plurality of video signal lines SL extends linearly in the Y direction. In contrast, since the video signal connecting lines SCL are the wirings connecting the video signal lines SL and the driver chip DRC1, as illustrated in FIG. 3, it has a bent portion between the video signal lines SL and the driver chip DRC1.

In the example illustrated in FIG. 3, there is a switching circuit (selection circuit) SWS between the video signal lines SL and the video signal connecting lines SCL. The switching circuit SWS is a multiplexer circuit constituted by a plurality of transistors, for example, and outputs a signal that has been input by selecting from the video signal line SL for each color. The switching circuit SWS operates as a selection switch selecting a type of the video signal such as a red signal, a green signal, or a blue signal, for example. In other words, the switching circuit SWS is a selection circuit selecting a type of the video signal Spic (see FIG. 4) supplied to the video signal lines SL. In this case, the number of the video signal connecting lines SCL connecting the switching circuit SWS and the driver chip DRC1 is smaller than the number of the video signal lines SL. In this way, by providing the switching circuit SWS, it is possible to reduce the number of the video signal connecting lines SCL, whereby it is possible to reduce the number of the video signal connecting lines SCL between the driver chip DRC1 and the switching circuit SWS. In a case where the switching circuit SWS is provided as illustrated in FIG. 3, it is possible to distinguish between the video signal lines SL and the video signal connecting lines SCL as follows. That is, a part (wiring portion) connecting the driver chip DRC1 and the switching circuit SWS is referred to as the video signal connecting lines SCL. Also, from a part (wiring portion) of the video line in a position overlapping with the display region DA to a part (wiring portion) thereof connected to the switching circuit SWS is referred to as the video signal lines SL.

Also, as illustrated in FIG. 3, the switching circuit SWS is curved conforming to a shape of a side on the Y1 side of the display region DA. More specifically, since the switching circuit SWS is constituted by the plurality of transistors, an array line of the plurality of transistors constituting the switching circuit SWS is curved along the shape of the side on the Y1 side of the display region DA. Since the switching circuit SWS is curved along the side on the Y1 side of the display region DA in this way, of the peripheral region SA, it is possible to reduce an area of a part on the Y1 side (bent portions BEN3 and BEN4 and an extension portion EXT4 illustrated in FIG. 1).

Also, the display device DSP1 includes a plurality of scanning signal lines GL, and a driving circuit GD as a scanning signal output circuit outputting a scanning signal Gsi input into the plurality of scanning signal lines GL (see FIG. 6). The driving circuit is provided on the substrate SUB1 in the peripheral region SA (see FIG. 1). The driver chip DRC1 is connected to the driving circuit via the control wiring GW. Each of the plurality of scanning signal lines GL extends in the X direction and is arrayed in the Y direction at an interval from each other. Each of the plurality of pixels PX is partitioned by each of the scanning signal lines GL in the Y direction. Accordingly, the number of the pixels PX arrayed along the Y direction corresponds to the number of the scanning signal lines GL. In the example illustrated in FIG. 3, n scanning signal lines GL are arrayed in an order of scanning signal lines GL1, GL2, and GLn from one side to the other side in the Y direction. Each of the plurality of scanning signal lines GL is drawn out to the peripheral region SA outside the display region DA and is connected to the driving circuit. Also, the plurality of scanning signal lines GL mutually cross the plurality of video signal lines SL. The scanning signal line GL includes a gate electrode GE of a transistor Tr1 serving as a pixel switch element PSW illustrated in FIG. 4.

In FIG. 3, a region in which the driving circuit GD is provided is schematically illustrated being surrounded with a frame. The driving circuit includes multiple types of circuit portions. For example, as illustrated in FIG. 6, the driving circuit GD includes a shift register circuit GSR, and a switching circuit (scanning signal switching circuit) GSW connected to the shift register circuit GSR and selecting a potential to be supplied to the scanning signal line GL based on a control signal. Also, the driving circuit GD is connected to the driver chip DRC1 via the control wiring GW. The driver chip DRC1 supplies a control signal such as a clock signal GCL and an enable signal ENB to the driving circuit GD via the control wiring GW.

In the example illustrated in FIG. 6, the clock signal GCL is transmitted to each of a plurality of shift register circuits GSR of the driving circuit GD via a clock line GWC. The enable signal ENB is transmitted to each of the plurality of switching circuits GSW of the driving circuit GD via an enable line GWE. The enable line GWE is a potential supply line supplying the potential as the scanning signal Gsi to the scanning signal line GL. In the example illustrated in FIG. 6, a scanning signal Gsi1 is supplied to the scanning signal line GL1, a scanning signal Gsi2 is supplied to the scanning signal line GL2, and a scanning signal Gsin is supplied to the scanning signal line GLn. As schematically illustrated in FIG. 6, each of the plurality of scanning signals Gsi is a pulse signal having a voltage level that changes corresponding to a timing of the clock signal GCL. A start pulse signal GSP is transmitted to the shift register circuit GSR that is driven first among the plurality of shift register circuits GSR via a start pulse line GWS.

In the example illustrated in FIG. 6, a set of the shift register circuit GSR and the switching circuit GSW constitutes a circuit block GDB1 or GDB2, and each of the circuit blocks GDB1 and GDB2 is connected to the scanning signal line GL. In FIG. 6, for easy understanding, one switching circuit GSW is connected to one shift register circuit GSR, and the scanning signal line GL is connected to each of the switching circuits GSW. However, there are various modifications of a circuit configuration of the circuit blocks GDB1 and GDB2. For example, it is also possible to connect the plurality of switching circuits GSW to one shift register circuit GSR.

Furthermore, a buffer circuit GBU is connected between the driving circuit GD and the driver chip DRC1. The buffer circuit GBU is a circuit relaying the potential to be supplied to the scanning signal line GL via the driving circuit GD. In a case where the buffer circuit GBU is interposed in a transmission path of the control signal, a waveform of a gate signal supplied to the driving circuit GD is corrected by the buffer circuit GBU. As illustrated in FIG. 6, the buffer circuit GBU and a power supply circuit PSC are connected to each other via a power supply wiring PL supplying a power supply potential to the driving circuit GD. More specifically, the buffer circuit GBU and the power supply circuit PSC are connected to each other via a wiring PLH in which a relatively high potential VDH is supplied and a wiring PLL in which a potential lower than the potential VDH is supplied. In the buffer circuit GBU, by using the potential VDH and a potential VDL, a waveform of the control signal such as the enable signal ENB is corrected and is output to the driving circuit GD. The power supply circuit PSC illustrated in FIG. 6 is formed in the wiring board FWB1, for example. As a modification, the power supply circuit PSC may also be formed outside the display device DSP1 and may be connected to the buffer circuit GBU through the wiring board FWB1.

In the example illustrated in FIG. 3, the driving circuit GD is disposed both on an X1 side which is one side, and an X2 side which is the other side, in the X direction. More specifically, in the X direction, there are a driving circuit (scanning signal line driving circuit, first driving circuit) GD1 on the X1 side and a driving circuit (scanning signal line driving circuit, second driving circuit) GD2 on the X2 side. Also, in the X direction, the display region DA is a region between the driving circuit GD1 and the driving circuit GD2. As illustrated in FIG. 3, a driving method in a state where the driving circuit GD is connected to both ends of the scanning signal lines GL is referred to as a both-side driving method of the scanning signal lines GL. Note that there are various modifications of a layout of the driving circuit GD. For example, in the X direction illustrated in FIG. 3, the driving circuit GD may also be disposed on any one of the X1 side and the X2 side. A driving method in a state where the driving circuit GD is connected to one end of the scanning signal lines GL while the driving circuit GD is not connected to the other end thereof is referred to as a one-side driving method of the scanning signal line GL. Also, for example, it is also possible that no buffer circuit GBU (see FIG. 6) is connected between the driver chip DRC1 and the driving circuit GD.

Also, as illustrated in FIG. 2, the display device DSP1 includes a common electrode (second electrode) CE. Also, as illustrated in FIG. 4, the display device DSP1 includes a common electrode driving circuit (also referred to as a common potential circuit) CD driving the common electrode CE when the display device DSP1 displays an image. The common electrode CE is electrically connected to the common electrode driving circuit CD via a common line CML. In the example illustrated in FIG. 4, the common electrode driving circuit CD is formed in the wiring board FWB1. The common electrode CE is an electrode in which a potential common to each of the plurality of pixels is supplied. Accordingly, one common electrode CE may be provided so as to overlap with the display region DA. Note that it is also possible to provide the common electrode CE that is divided into a plurality of electrodes so as to overlap with the display region DA.

Note that there are various modifications of a position where the common electrode driving circuit CD is formed in addition to an aspect illustrated in FIG. 3. For example, the common electrode driving circuit CD may be formed in the driver chip DRC1. Furthermore, for example, an embodiment in which the common electrode driving circuit CD is disposed on the substrate SUB1 illustrated in FIG. 1 is also included in the aspect in which the common electrode driving circuit CD is formed in the peripheral region SA. It is also possible that, for example, the common electrode driving circuit CD is formed outside the display device DSP1 and is connected to the wiring board FWB1.

As illustrated in FIG. 4, the pixel PX includes the pixel switch element PSW, and a pixel electrode PE. Also, in the example of this embodiment, the plurality of pixels PX share the common electrode CE. The pixel switch element PSW includes, for example, the transistor Tr1 that is a thin film transistor (TFT). The pixel switch element PSW is electrically connected to the scanning signal line GL and the video signal line SL. More specifically, a source electrode SE of the transistor Tr1 serving as the pixel switch element PSW is connected to the video signal lines SL, and a drain electrode DE thereof is connected to the pixel electrode PE. Also, the gate electrode GE of the transistor Tr1 is included in the scanning signal line GL. The driving circuit (see FIG. 3) supplies the potential (scanning signal Gsi illustrated in FIG. 6) to the gate electrode GE and controls a state of supply of the video signal Spic to the pixel electrode PE by on-off operating the pixel switch element PSW. In other words, the transistor Tr1 functions as the pixel switch element PSW controlling supply of the potential to the pixel electrode PE.

The pixel switch element PSW may be either of a top gate type TFT or a bottom gate type TFT. Also, a material of a semiconductor layer of the pixel switch element PSW is polycrystalline silicon (polysilicon), for example; however, it may also be an oxide semiconductor or amorphous silicon.

The pixel electrode PE is opposed to the common electrode CE interposing an insulating film 14 (see FIG. 2). The common electrode CE, the insulating film 14, and the pixel electrode PE form a holding capacitor CS. During a display operation period in which a display image is formed based on a video signal, an electric field is formed between the pixel electrode PE and the common electrode CE based on a driving signal applied to each of the electrodes. Then, a liquid crystal molecule constituting the liquid crystal layer LQ, which is the electro-optical layer, is driven by the electric field formed between the pixel electrode PE and the common electrode CE. For example, in the display device DSP1 using the horizontal electric field mode as in this embodiment, the pixel electrode PE and the common electrode CE are provided in the substrate SUB1 as illustrated in FIG. 2. The liquid crystal molecule constituting the liquid crystal layer LQ is rotated using the electric field (for example, in a fringe field, an electric field that is substantially in parallel to a principal surface of a substrate) formed between the pixel electrode PE and the common electrode CE.

That is, during the display operation period, each of the pixel electrode PE and the common electrode CE operates as a driving electrode driving the liquid crystal layer LQ, which is the electro-optical layer. In other words, each of the plurality of pixel electrodes PE is the first electrode driving the electro-optical layer. Furthermore, each of the common electrodes CE is the second electrode driving the electro-optical layer.

As illustrated in FIG. 2, the substrate SUB1 and the substrate SUB2 are bonded together in a state of being separated from each other. The liquid crystal layer LQ is sealed between the substrate SUB1 and the substrate SUB2. The substrate SUB1 includes an insulating substrate 10 having optical transparency, for example, a glass substrate and a resin substrate. Also, the substrate SUB1 has a plurality of conductor patterns on the insulating substrate 10 on a side thereof facing the substrate SUB2. The plurality of conductor patterns include the plurality of scanning signal lines GL, the plurality of video signal lines SL, a plurality of common lines CML, the plurality of common electrodes CE, and the plurality of pixel electrodes PE. Also, an insulating film is interposed between the conductor patterns. As the insulating films disposed between the adjacent conductor patterns and insulating the conductor patterns from each other, there are included an insulating film 11, an insulating film 12, an insulating film 13, an insulating film 14, and an alignment film AL1. Note that, in FIG. 2, one each of the scanning signal lines GL, the common electrodes CE, and the common lines CML is illustrated.

Each of the plurality of conductor patterns described above is formed in a plurality of wiring layers that are layered. In the example illustrated in FIG. 2, each of the common electrode CE and the pixel electrodes PE is formed in a different layer, and below the layer in which the common electrode CE is formed, three wiring layers are provided. In a wiring layer WL1 of a first layer that is provided the closest to the insulating substrate 10 among the three wiring layers formed over the insulating substrate 10, mainly the scanning signal line GL is formed. The conductor pattern formed in the wiring layer WL1 is made of, for example, metal such as chrome (Cr), titanium (Ti), and molybdenum (Mo), or an alloy thereof.

The insulating film 11 is formed over the wiring layer WL1 and the insulating substrate 10. The insulating film 11 is a transparent insulating film made of, for example, silicon nitride, silicon oxide, or the like. Note that, between the insulating substrate 10 and the insulating film 11, there are formed the gate electrode of the pixel switch element, the semiconductor layer, and the like in addition to the scanning signal line GL.

Over the insulating film 11, a wiring layer WL2 of a second layer is formed. In the wiring layer WL2, mainly the video signal lines SL are formed. The wiring layer (second wiring layer) WL2 is made of a material having lower resistivity than that of the wiring layer (first wiring layer) WL1. The conductor pattern formed in the wiring layer WL2 is made of a metal film having a multilayer structure, for example, in which aluminum (Al) is sandwiched with molybdenum (Mo), titanium (Ti), or the like. It is preferred that a wiring material of the wiring layer WL2 have a lower specific resistance than that of a wiring material of the wiring layer WL1. Also, the source electrode, the drain electrode, and the like of the pixel switch element are formed over the insulating film 11. In the example illustrated in in FIG. 2, the video signal lines SL extend in the Y direction. The insulating film 12 is formed over each of the video signal lines SL and the insulating film 11.

Also, in the example illustrated in FIG. 2, over the insulating film 12, a wiring layer WL3 of a third layer is formed. In the wiring layer WL3, mainly the common line CML is formed. The conductor pattern formed in the wiring layer WL3, in the same way as in the wiring layer WL2, is made of a metal film having a multilayer structure, for example, in which aluminum (Al) is sandwiched with molybdenum (Mo), titanium (Ti), or the like. In the example illustrated in FIG. 2, the common line CML extends in the Y direction. The insulating film 13 is formed over each of the common line CML and the insulating film 12. Note that, in FIG. 2, an example is illustrated in which wirings such as the scanning signal line GL, the video signal lines SL, and the common line CML are disposed in the three wiring layers, respectively. However, the number of the wiring layers is not limited to the above, and various modifications are possible. For example, it is possible not to provide the wiring layer WL3 illustrated in FIG. 2. In this case, the common line CML may be formed in the same layer as the layer in which the common electrode CE is formed, for example.

In FIG. 2, an enlarged cross-section of the display region DA illustrated in FIG. 1 is illustrated, and each of the wiring layers WL1, WL2, and WL3 illustrated in FIG. 2 is also disposed in the peripheral region SA illustrated in FIG. 1. The video signal connecting lines SCL, the control wiring GW, and the power supply wiring PL illustrated in FIG. 3 are formed in one or more wiring layers of the wiring layers WL1, WL2, and WL3. Furthermore, each of a plurality of circuits disposed in the peripheral region SA, such as the switching circuit SWS illustrated in FIG. 3, is formed in one or more wiring layers of the wiring layers WL1, WL2, and WL3.

As illustrated in FIG. 2, the common electrode CE is formed over the insulating film 13. It is preferred that the common electrode CE be made of a transparent conductive material such as indium tin oxide (ITO) or indium zinc oxide (IZO). Note that, in a case where the display device is a display device in the TN mode, the VA mode, or the like, which is the vertical electric field mode, the common electrode CE may also be formed in the substrate SUB2. Also, in the cross-section illustrated in FIG. 2, the insulating film 13 is interposed between the common electrode CE and the common line CML. Note that a part of the common line CML and a part of the common electrode CE are electrically connected to each other as illustrated in FIG. 4. In a case of a reflection type display device using reflection of light from the outside, the common electrode CE may also be made of a metal material.

The insulating film 14 is formed over the insulating film 13 and the common electrode CE. The pixel electrodes PE are formed over the insulating film 14. In plan view, each of the pixel electrodes PE is positioned between two adjacent video signal lines SL and is arranged in a position facing the common electrode CE. It is preferred that the pixel electrodes PE be made of a transparent conductive material such as ITO and IZO or a metal material, for example. The alignment film AL1 covers the pixel electrodes PE and the insulating film 14.

Meanwhile, the substrate SUB2 includes an insulating substrate 20 having optical transparency such as a glass substrate and a resin substrate. The substrate SUB2 also includes, over the insulating substrate 20 on a side thereof facing the substrate SUB1, the light shielding layer BM that is a light shielding film, color filters CFR, CFG, and CFB, an overcoating layer OCL, an alignment film AL2, and a conductive film CDF.

The conductive film CDF is disposed on a surface opposite to a surface facing the liquid crystal layer LQ among planes of the insulating substrate 20. The conductive film CDF, for example, is made of a transparent conductive material such as ITO or IZO. The conductive film CDF functions as a shield layer preventing an electromagnetic wave from the outside from affecting the liquid crystal layer LQ and the like. Also, in a case where a method of driving the liquid crystal layer LQ is the vertical electric field mode such as the TN mode and the VA mode, an electrode is provided to the substrate SUB2. This electrode also functions as a shield layer, whereby it is possible to omit the conductive film CDF.

The display device DSP1 includes an optical element OD1 and an optical element OD2. The optical element OD1 is disposed between the insulating substrate 10 and a backlight unit BL. The optical element OD2 is disposed above the insulating substrate 20, that is, disposed on an opposite side of the substrate SUB1 interposing the insulating substrate 20. Each of the optical element OD1 and the optical element OD2 includes at least a polarizer and may also include a wave plate as necessary.

<Planar Shape of Display Device and Circuit Layout>

Figure 7:
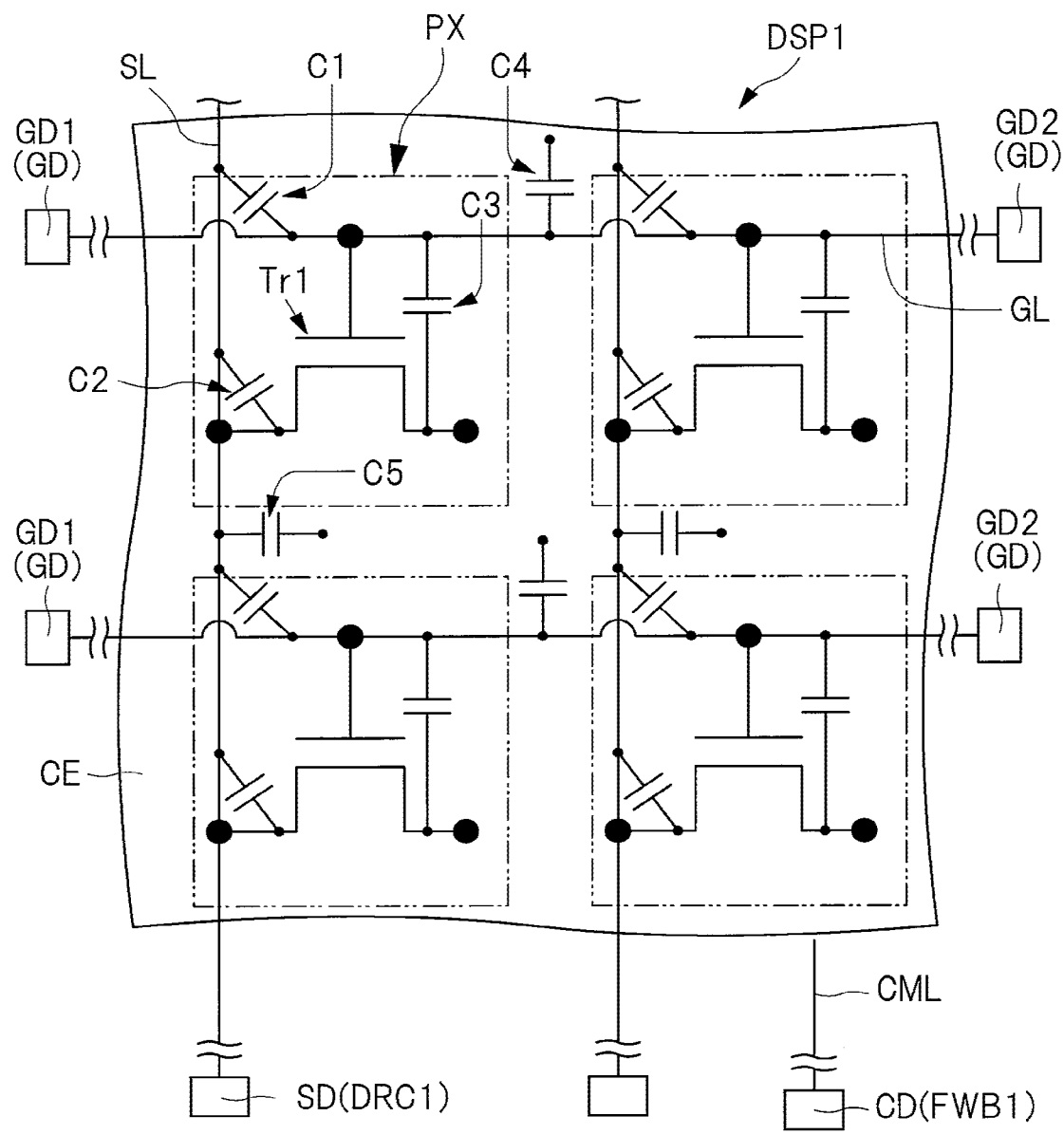
FIG. 7 is a circuit diagram schematically illustrating a factor of a load that is given to each of a plurality of pixels illustrated in FIG. 3.
Figure 8:
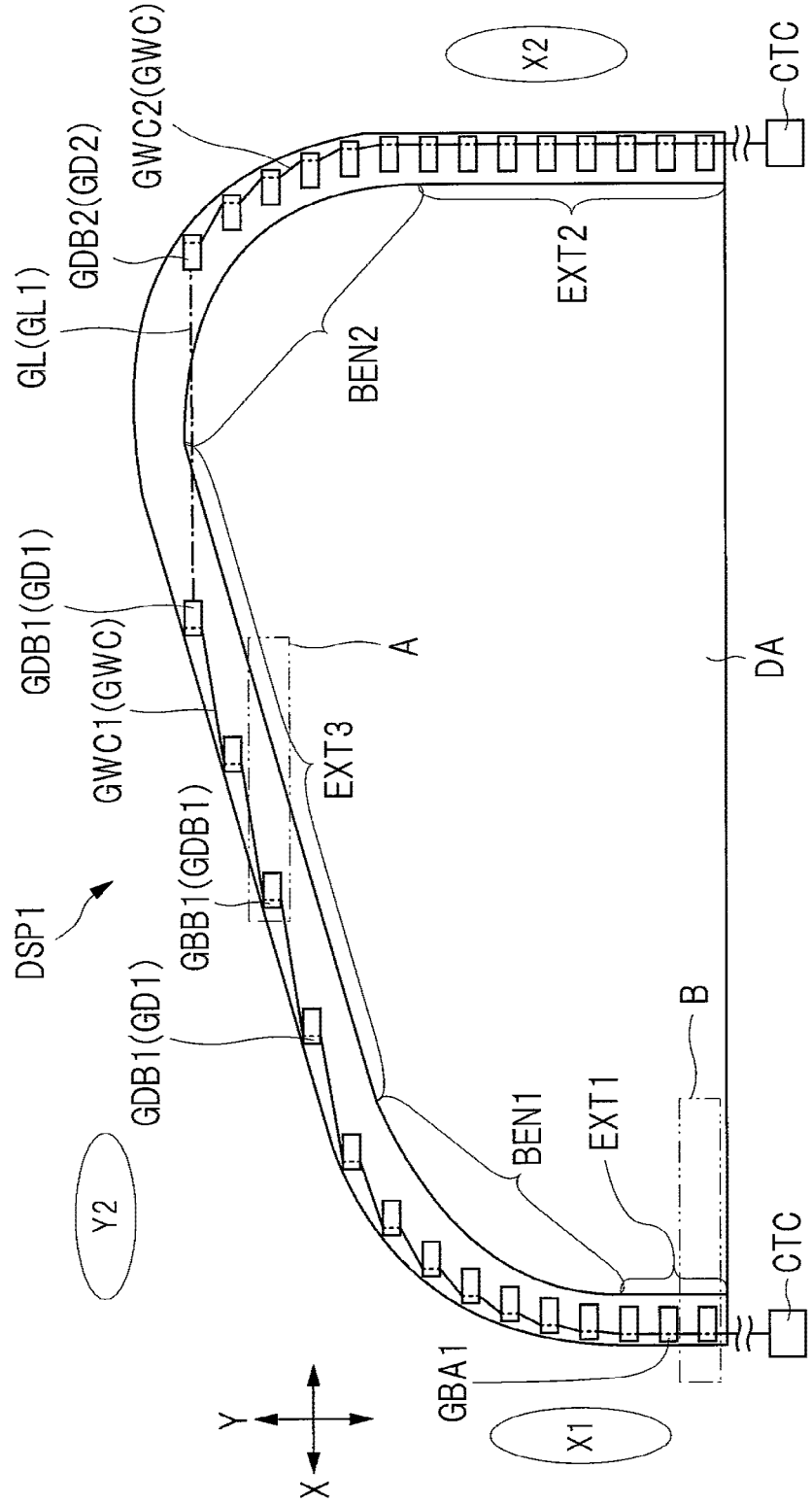
FIG. 8 is an enlarged plan view illustrating details of a circuit configuration of an upper side of the display device illustrated in FIG. 3.

Next, a relation between a planar shape of the display device and a circuit layout according to this embodiment will be described. FIG. 7 is a circuit diagram schematically illustrating a factor of a load that is given to each of a plurality of pixels illustrated in FIG. 3. Also, FIG. 8 is an enlarged plan view illustrating details of a circuit configuration of an upper side of the display device illustrated in FIG. 3. Also, FIG. 22 is an explanatory drawing illustrating an exemplary layout of a scanning signal line driving circuit of a display device that is a study example of the display device illustrated in FIG. 3, and FIG. 23 is an explanatory drawing illustrating an exemplary layout of a scanning signal line driving circuit of a display device that is another study example of the display device illustrated in FIG. 3.

Note that, in FIG. 7, to explicitly illustrate that the common electrode CE is disposed across the plurality of pixels PX, a sheet-like common electrode CE is illustrated. Also, in FIG. 8, to make the circuit layout of the driving circuits GD1 and GD2 easy to see, among the plurality of control wirings GW illustrated in FIG. 6, the clock line GWC transmitting a clock signal is representatively illustrated. For the same reason, in FIG. 8, there are illustrated the circuit blocks GDB1 and GDB2 that are provided to the driving circuit GD illustrated in FIG. 6. To each of the plurality of circuit blocks GDB1 and GDB2, at least one or more scanning signal lines GL are connected; however, in FIG. 8, to make it easy to see, the scanning signal line GL1 which is arrayed the closest to the Y2 side in the Y direction is indicated with an alternate long and short dash line, and illustration of the other scanning signal line GL is omitted.

As illustrated in FIG. 1, in the display device DSP1 according to this embodiment, a planar shape of the display region DA and a shape of the peripheral region SA are "irregular shapes." In the example illustrated in FIG. 1, the display device DSP1 is also used as a rearview mirror of a vehicle for checking rearward, and the planar shape of the display region DA and the external shape of the peripheral region SA are trapezoids. Also, in plan view, a shape of the light shielding layer BM disposed in the periphery of the display region DA is as follows. That is, the light shielding layer BM includes an extension portion (first extension portion) EXT1 and an extension portion (second extension portion) EXT2 each extending along the Y direction. Also, the light shielding layer BM has a bent portion (first bent portion) BENT and a bent portion (second bent portion) BEN2 between the extension portion EXT1 and the extension portion EXT2. Also, the extension portion EXT1 is connected to the bent portion BENT, and the extension portion EXT2 is connected to the bent portion BEN2. Also, a length of the extension portion EXT2 is longer than a length of the extension portion EXT1. Also, in the example illustrated in FIG. 1, the light shielding layer BM has an extension portion (third extension portion) EXT3 between the bent portion BENT and the bent portion BEN2. The extension portion EXT3 has a side (inner edge side) extending along a direction T1 which is inclined relative to each of the Y direction and the X direction. Note that the direction which is inclined relative to the Y direction means a direction forming an angle other than a right angle or not in parallel to the Y direction. In the same way, the direction which is inclined relative to the X direction means a direction forming an angle other than a right angle or not in parallel to the X direction.

Note that the bent portion means a part where an extension direction changes. The bent portion includes a part where it is curved in a rounded manner in addition to a part where it is bent as illustrated in FIG. 1. In a case where it is curved in a rounded manner, a change amount (angle) of the extension direction of the curved part/total length of the curved part may be defined as a curvature.

Figure 11:
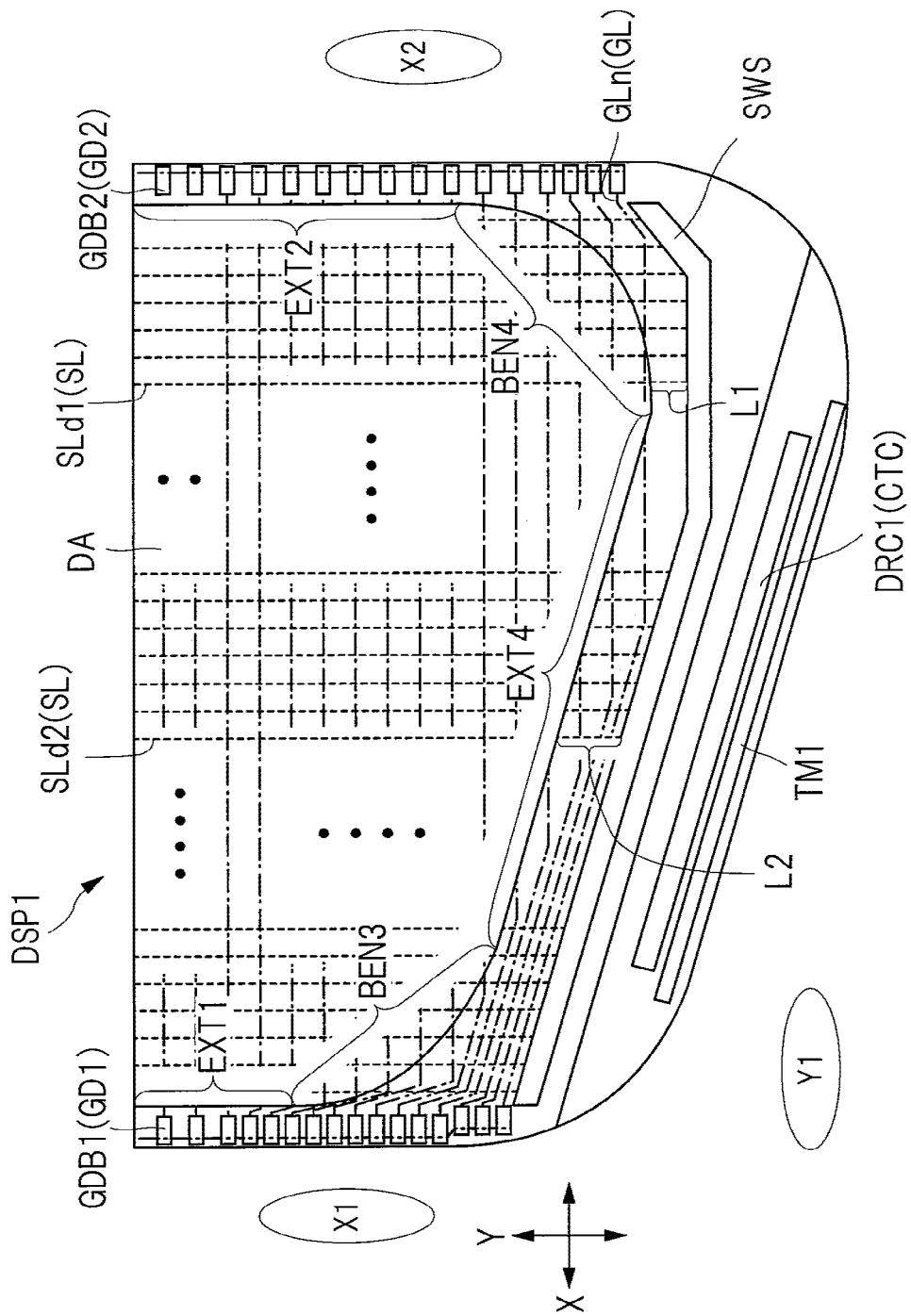
FIG. 11 is an enlarged plan view illustrating details of a circuit configuration of a lower side of the display device illustrated in FIG. 3.

Also, in the example illustrated in FIG. 1, the light shielding layer BM has the bent portion (third bent portion) BEN3 opposite to the bent portion BENT interposing the extension portion EXT1. Also, the light shielding layer BM has the bent portion (fourth bent portion) BEN4 opposite to the bent portion BEN2 interposing the extension portion EXT2. Also, the light shielding layer BM has the extension portion (fourth extension portion) EXT4 between the bent portion BEN3 and the bent portion BEN4, and the extension portion EXT4 has a side (inner edge side) extending along a direction T2 which is inclined relative to each of the Y direction and the X direction. In the example of this embodiment, the display region DA constitutes a trapezoid, whereby the direction T1 and the direction T2 are not in parallel to each other. Also, in the example illustrated in FIG. 1, the direction T2 and the direction T3 are in parallel to each other. The description "the direction T2 and the direction T3 are in parallel to each other" includes a case in which these directions are strictly in parallel in addition to a case in which, even though these directions are not strictly in parallel due to an influence of processing accuracy and the like, they are regarded as being substantially in parallel to each other. Note that, in FIG. 1, the bent portion BEN3 is described as the third bent portion and the bent portion BEN4 is described as the fourth bent portion so as to distinguish them from the bent portion BEN1 and the bent portion BEN2 on the Y2 side in the Y direction. Note that, as illustrated in FIG. 11 described below, focusing on the part on the Y1 side, it is possible to reword the bent portion BEN3 as the first bent portion and the bent portion BEN4 as the second bent portion. In the same way, the extension portion EXT4 is described as the fourth extension portion; however, it is also possible to reword it as the third extension portion.

Here, from a viewpoint of improving quality of an image displayed on the display device DSP1, it is preferred that a value of a load (for example, an impedance value caused by parasitic capacitance, wiring resistance, and the like) given to each of the plurality of pixels PX arrayed in the display region DA be made even within a plane overlapping with the display region DA. Within the display region DA, when an in-plane distribution of the value of the load on the pixels PX becomes uneven, it may cause deterioration of image quality such as display unevenness.

A load factor given to each of the plurality of pixels PX Includes a parasitic capacitance C1 to a parasitic capacitance C5 as well as wiring resistance of each of the scanning signal lines GL and wiring resistance of each of the video signal lines SL illustrated in FIG. 7. The parasitic capacitance C1 is parasitic capacitance between the scanning signal line GL and the video signal line SL. The parasitic capacitance C2 is parasitic capacitance between a source electrode and a drain electrode of the transistor Tr1, and the video signal line SL. The parasitic capacitance C3 is parasitic capacitance between the source electrode and the drain electrode of the transistor Tr1, and the scanning signal line GL. Also, the parasitic capacitance C4 is parasitic capacitance between the scanning signal line GL and the common electrode CE. The parasitic capacitance C5 is parasitic capacitance between the video signal line SL and the common electrode CE.

Also, in this embodiment, the plurality of pixels PX are connected to one scanning signal line GL. Also, the plurality of pixels PX are connected to one video signal line SL. Accordingly, as the number of the pixels PX connected to each of the plurality of scanning signal lines GL becomes large, the value of the load given to the pixels PX becomes large. In the same way, as the number of the pixels PX connected to each of the plurality of video signal lines SL becomes large, the value of the load given to the pixels PX becomes large. In other words, the load factor given to the plurality of pixels PX includes the number of the pixels PX connected to each of the plurality of scanning signal lines GL. Also, the load factor given to the plurality of pixels PX includes the number of the pixels PX connected to each of the plurality of video signal lines SL.

Also, in this embodiment, a driving circuit is connected to either end of the scanning signal lines GL. In other words, each of the plurality of scanning signal lines GL is driven by the both-side driving method. In this way, in a case where the plurality of scanning signal lines GL are driven by the both-side driving method, when a part of the plurality of scanning signal lines GL is driven by the one-side driving method, it may be a cause of making the in-plane distribution of the load given to the plurality of scanning signal lines GL uneven. That is, from a viewpoint of improving the image quality, it is preferred that all of the scanning signal lines GL be driven by the both-side driving method.

Supposedly, when the planar shape of the display region DA is a square or a rectangle, it is easy to make each length of the plurality of scanning signal lines GL even and to make each length of the plurality of video signal lines SL even. Accordingly, it is relatively easy to set the value of the load given to each of the plurality of pixels PX arrayed so as to overlap with the display region DA, to be substantially constant.

However, as in this embodiment, in the display device DSP1 having the display region DA of an irregular shape, the in-plane distribution of the value of the load given to each of the plurality of pixels PX may easily become uneven. For example, as in a display device DSPh1 illustrated in FIG. 22, in a case where the driving circuit is not disposed between the bent portion BEN1 and the bent portion BEN2 so as to overlap therewith, the one-side driving method is applied to a part in the display region DA. Also, as in a display device DSPh2 illustrated in FIG. 23, for example, in a case where an extension distance of the driving circuit GD1 is equal to an extension distance of the driving circuit GD2, an external shape (planar shape) of the display device DSPh2 is a rectangle. In this case, a size of the display device DSPh2 is further increased.

In a case of the display device DSP1 according to this embodiment, as illustrated in FIG. 3, the driving circuit GD1 extends to the vicinity of the bent portion BEN2 (see FIG. 2) across a region overlapping with the bent portion BEN1 (see FIG. 1). In other words, in plan view, the bent portion BEN2 is located between a termination portion of the driving circuit GD1 and a termination portion of the driving circuit GD2. Accordingly, the driving circuits GD are connected to both ends of the scanning signal line GL1 which is arrayed the closest to the Y2 side in the Y direction among the plurality of scanning signal lines GL. In other words, each of the plurality of scanning signal lines GL including the scanning signal line GL1 is driven by the both-side driving method. Accordingly, it is possible to prevent deterioration of image quality caused by a part of the plurality of scanning signal lines GL being driven by the one-side driving method.

As described above, in FIG. 3, the region in which the driving circuit GD is provided is schematically illustrated being surrounded with the frame; however, the driving circuit GD includes multiple types of circuits. The above-described configuration may also be described in the following by using clock lines GWC1 and GWC2 illustrated in FIG. 8. That is, the display device DSP1 includes the clock line (first clock line) GWC1 connecting the control circuit CTC to the driving circuit GD1 and in which a clock signal (first clock signal) GCL1 (see FIG. 6) is supplied, and the clock line (second clock line) GWC2 connecting the control circuit CTC to the driving circuit GD1 and in which a clock signal (second clock signal) GCL2 (see FIG. 6) is supplied. Also, in plan view, the bent portion BEN1 overlaps with the clock line GWC1, and the bent portion BEN2 is located between a termination portion of the clock line GWC1 and a termination portion of the clock line GWC2. As illustrated in FIG. 8, the termination portion of the clock line GWC1 is located between the bent portion BEN1 and the bent portion BEN2. In the example illustrated in FIG. 8, the termination portion of the clock line GWC2 overlaps with the bent portion BEN2 while the termination portion of the clock line GWC1 does not overlap with the bent portion BEN2.

Also, as described above, from a viewpoint of making the in-plane distribution of the load even, it is preferred that the number of the pixels PX (see FIG. 7) connected to each of the plurality of scanning signal lines GL be even. However, as illustrated in FIG. 3, in the display device DSP1 having the display region DA of an irregular shape, since a length of the display region DA in the X direction, which is the extension direction of the scanning signal line GL, is not a fixed value, the number of the corresponding pixels PX is different for each of the scanning signal lines GL. For example, in the example illustrated in FIG. 8, in the display region DA, a length of a part sandwiched by the extension portion EXT3 and the bent portion BEN2 in the X direction is shorter than a length of a part sandwiched by the extension portion EXT1 and the extension portion EXT2 in the X direction. Accordingly, the number of the pixels PX arranged in a part having a relatively short length in the X direction is small.

Figure 9:
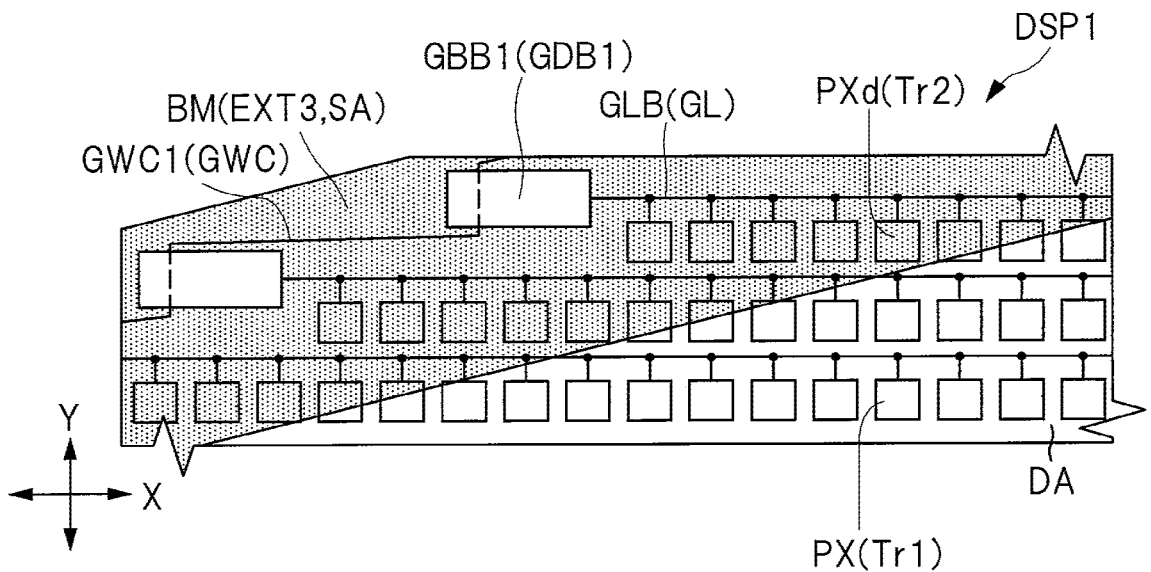
FIG. 9 is an enlarged plan view of a part A in FIG. 8.
Figure 12:
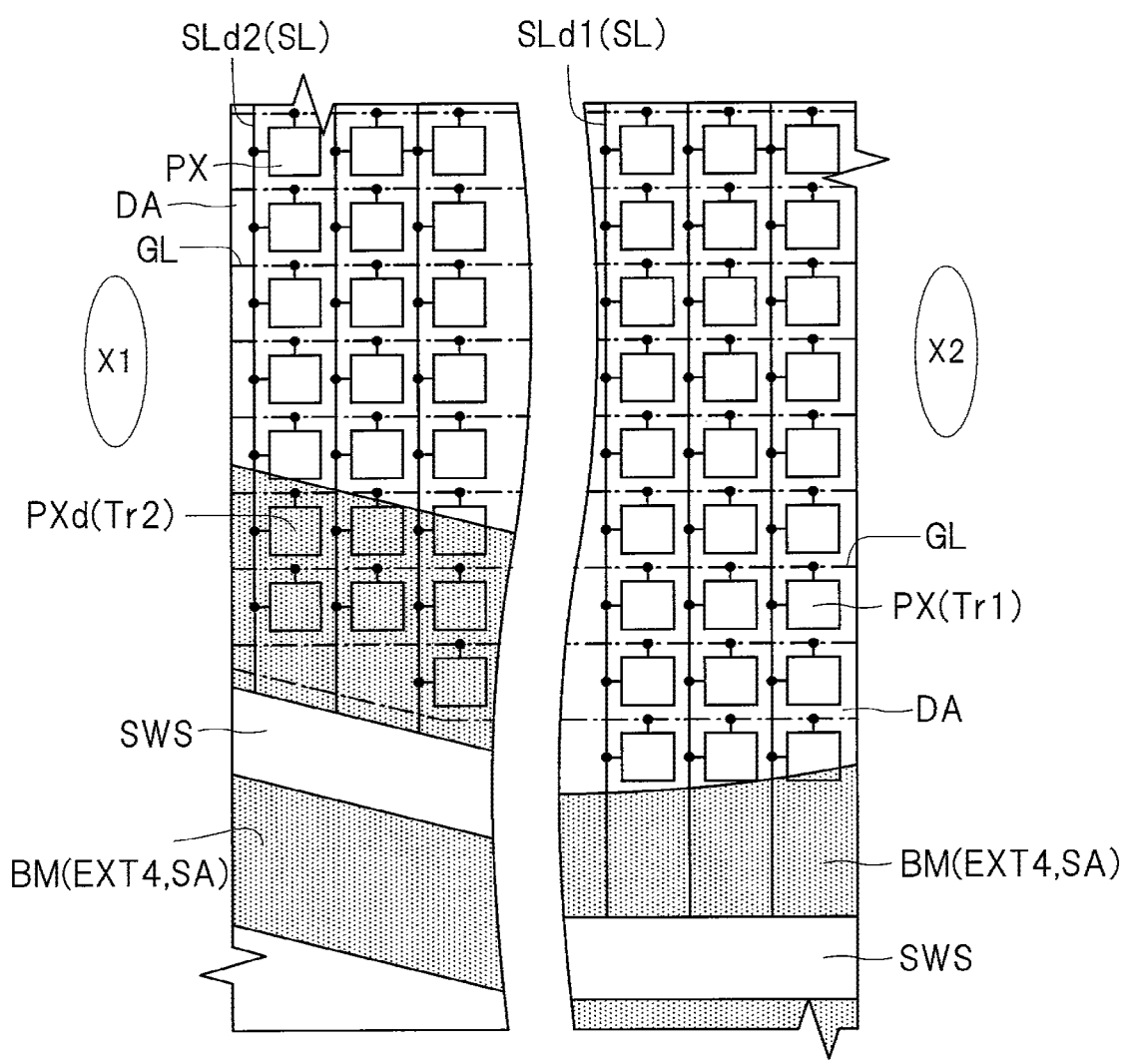
FIG. 12 is an enlarged plan view illustrating an exemplary layout of pixels in a region between the display region and a switching circuit illustrated in FIG. 11.

Accordingly, it is preferred that a dummy pixel (second pixel) PXd (see FIG. 9) be provided in a part of the peripheral region SA (see FIG. 1) and that the dummy pixel PXd be connected to the scanning signal line GL having the relatively small number of the corresponding pixels PX. Accordingly, it is possible to reduce variation of the load caused by the number of the pixels PX connected to each of the plurality of scanning signal lines GL. Since the dummy pixel PXd is located in the peripheral region SA (see FIG. 1), the dummy pixel PXd is different from the pixel PX in that the dummy pixel PXd overlaps with the light shielding layer BM (see FIG. 1), but the dummy pixel PXd is the same in the other points as the pixel PX in the display region DA. The dummy pixel PXd includes at least a transistor Tr2, and a part of the scanning signal lines GL constitutes a gate electrode GE of the transistor Tr2. The transistor Tr2 is a semiconductor element having the same structure as the transistor Tr1 illustrated in FIG. 4. Also, although illustration of the video signal lines SL is omitted in FIG. 9, as illustrated in FIG. 12 described below, it is also possible to connect the video signal lines SL to the dummy pixel PXd. Note that, as illustrated in FIG. 9, for example, in a case where a part of the pixel PX (for example, a part of the pixel electrode PE illustrated in FIG. 2) overlaps with the light shielding layer BM and the other part thereof does not overlap with the light shielding layer BM, the pixel PX is handled as a non-dummy pixel PX. However, in a case where a configuration of the pixel PX, which has a part thereof overlapping with the light shielding layer BM, is insufficient compared to the configuration described with reference to FIG. 4, the pixel PX is handled as the dummy pixel PXd. Also, in a case where the pixel PX does not directly contribute to forming a display image such as when most part of the pixel PX overlaps with the light shielding layer BM, for example, the pixel PX is handled as the dummy pixel PXd.

Figure 10:
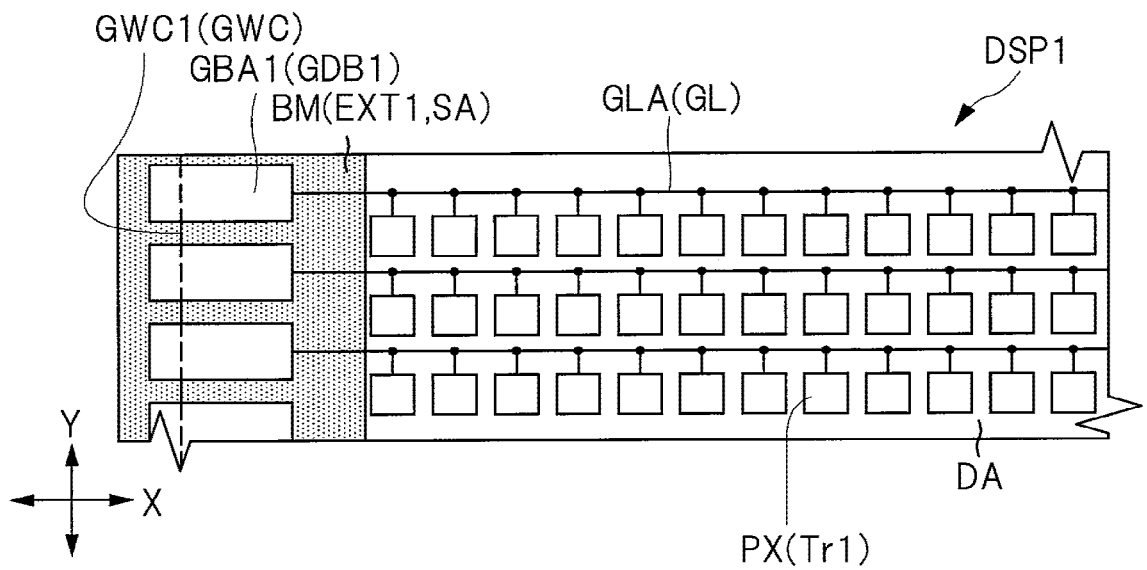
FIG. 10 is an enlarged plan view of a part B in FIG. 8.

A configuration for reducing the variation of the load caused by the number of the pixels PX connected to each of the plurality of scanning signal lines GL by using the dummy pixel PXd may be described as follows. FIG. 9 is an enlarged plan view of a part A in FIG. 8. Also, FIG. 10 is an enlarged plan view of a part B in FIG. 8. The driving circuit GD1 includes a circuit block (first A circuit block) GBA1 (see FIG. 10) and a circuit block (first B circuit block) GBB1 (see FIG. 9) connected via the clock line GWC1. The circuit block GBA1 overlaps with the extension portion EXT1 of the light shielding layer BM, and the circuit block GBB1 overlaps with the extension portion EXT3. In this case, the number of the pixels PX connected to a scanning signal line GLB connected to the circuit block GBB1 illustrated in FIG. 9 is smaller than the number of the corresponding pixels PX of a scanning signal line GLA connected to the circuit block GBA1 illustrated in FIG. 10. In contrast, the number of the dummy pixels PXd connected to the scanning signal line GLB connected to the circuit block GBB1 is larger than the number of the dummy pixels PXd connected to the scanning signal line GLA connected to the circuit block GBA1. Accordingly, it is possible to reduce a difference between total numbers of the pixels PX and the dummy pixels PXd connected to each of the scanning signal lines GL.

Note that, in the example illustrated in FIG. 10, the dummy pixel PXd (see FIG. 9) is not connected to the scanning signal line GLA. In other words, zero dummy pixel PXd is connected to the scanning signal line GLA. In description "the number of the dummy pixels PXd connected to the scanning signal lines GLB is larger than the number of the dummy pixels PXd connected to the scanning signal line GLA," there is also included a case in which in the dummy pixel PXd (see FIG. 9) is not connected to the scanning signal line GLA as illustrated in FIG. 10. Also, as a modification, there is also a case in which the relatively small number of the dummy pixels PXd is connected to the scanning signal line GLA. In the present application, in the same way as above, description that "the number of A is larger than the number of B" or "the number of A is smaller than the number of B" also includes a case in which either of the number of A or the number of B is zero.

As described above, to one of oblique sides of the display device DSP1 having a trapezoidal planar shape, or a side along the extension portion EXT3 illustrated in FIG. 8, it is possible to dispose the driving circuit GD1 along the oblique side. Accordingly, it is possible to apply the both-side driving method of the scanning signal line GL up to the termination portion of the driving circuit GD1 and the termination portion of the driving circuit GD2, in other words, to the termination portion of the clock line GWC1 and the termination portion of the clock line GWC2. In contrast, to the other of the oblique sides of the display device DSP1 having the trapezoidal planar shape, or a side along the extension portion EXT4 (see FIG. 1), the switching circuit SWS is disposed, and the plurality of video signal lines SL extend toward the display region DA. Accordingly, it is difficult to dispose the driving circuit GD1 or the driving circuit GD2 along the extension portion EXT4. That is, each of the driving circuit GD1 and the driving circuit GD2 has a circuit layout different between a side on the Y1 side and a side on the Y2 side in the Y direction illustrated in FIG. 3.

FIG. 11 is an enlarged plan view illustrating details of a circuit configuration of a lower side of the display device illustrated in FIG. 3. Also, FIG. 12 is an enlarged plan view illustrating an exemplary layout of the pixels in a region between the display region and the switching circuit illustrated in FIG. 11. As illustrated in FIG. 11, the display device DSP1 is provided with the switching circuit (selection circuit) SWS between the display region DA and the driver chip DRC1 in which the control circuit CTC (see FIG. 6) is formed. Also, in plan view, there is neither the driving circuit GD1 nor the driving circuit GD2 between the switching circuit SWS and the display region DA. In a case where the driving circuits GD1 and GD2 are disposed between the switching circuit SWS and the display region DA, depending on positions of the driving circuits GD1 and GD2, it is necessary to curve some of the plurality of video signal lines SL. The total number of the video signal lines SL is larger than the total number of the scanning signal lines GL. In such case, in a case where some of the video signal lines SL are curved, a wiring layout becomes complicated around the curved part. Accordingly, it is preferred that each of the plurality of video signal lines SL be not curved but be linearly extended. As illustrated in FIG. 11, in this embodiment, since the driving circuits GD1 and GD2 are not disposed between the switching circuit SWS and the display region DA, each of the plurality of video signal lines SL has no bent portion in the middle and is linearly extended along the Y direction.

Note that, depending on the number of the circuit blocks GDB1 and GDB2 constituting the driving circuits GD1 and GD2, respectively, there is a case in which some of the plurality of circuit blocks GDB1 may be disposed between the switching circuit SWS and the display region DA. An aspect thereof will be described below.

In a case where the both-side driving method is applied to each of the plurality of scanning signal lines GL, the number of the circuit blocks GDB1 is the same as the number of the circuit blocks GDB2. However, since the extension portion EXT1 and the extension portion EXT2 have different lengths as described above, respective spaces in which the circuit blocks GDB1 and GDB2 are disposed are different from each other. That is, as described above, the extension portion EXT2 is longer than the extension portion EXT1 in the Y direction. In this case, in a region overlapping with the extension portion EXT2, it is possible to secure a larger space in which the plurality of circuit blocks GDB2 are disposed. Accordingly, the plurality of circuit blocks GDB2 are linearly arrayed along the Y direction. In other words, it is easy to dispose the plurality of circuit blocks GDB2 by avoiding a space between the switching circuit SWS and the display region DA.

In the Y direction, however, the extension portion EXT1 is shorter than the extension portion EXT2. A region overlapping with the extension portion EXT1 is a space in which the plurality of circuit blocks GDB1 are disposed, and an area thereof is smaller than an area of the region overlapping with the extension portion EXT2. As a result, the plurality of circuit blocks GDB1 are disposed not only in the region overlapping with the extension portion EXT1 but also in a region overlapping with the bent portion BEN3. The circuit blocks GDB1 overlapping with the bent portion BEN3 are disposed at a smaller pitch than the circuit blocks GDB2 overlapping with the extension portion EXT2. However, as the number of the circuit blocks GDB1 overlapping with the bent portion BEN3 is increased, some of the circuit blocks GDB1 are disposed closer to the X2 side in the X direction as illustrated in FIG. 11. Then, depending on the position of the switching circuit SWS, a part of the circuit blocks GDB1 disposed closer to the X2 side may also be disposed between the display region DA and the switching circuit SWS.

Also, in the example illustrated in FIG. 11, each of the plurality of video signal lines SL extends from the switching circuit SWS toward the display region DA. Each of the plurality of video signal lines SL has a different length from the switching circuit SWS to the display region DA. That is, the plurality of video signal lines SL include a video signal line (first video signal line) SLd1 and a video signal line (second video signal line) SLd2. In plan view, a length L2 of the video signal line SLd2 from the switching circuit SWS to the display region DA is longer than a length L1 of the video signal line SLd1 from the switching circuit SWS to the display region DA.

As illustrated in FIG. 11, among the plurality of scanning signal lines GL, the scanning signal line GLn disposed in a position the closest to the switching circuit SWS crosses the video signal line SLd1 within the display region DA. Since the video signal line SLd1 does not need to cross the scanning signal line GL outside the display region DA, it is possible to make the length L1 relatively short. In contrast, the scanning signal line GLn crosses the video signal line SLd2 outside the display region DA (more specifically, between the display region DA and the switching circuit SWS). By allowing some of the plurality of scanning signal lines GL to cross the video signal lines SLd2 outside the display region DA) in this way, it is possible to make the number of crossing between the video signal line SL and each of the scanning signal lines GL even. As described with reference to FIG. 7, the parasitic capacitance C1 between the scanning signal line GL and the video signal line SL is one of the load factors given to the pixel PX. Thus, by making the number of crossing between each of the plurality of video signal lines SL and each of the plurality of scanning signal lines GL even, it is possible to reduce variation in in-plane distribution of the load given to the pixel PX.

Also, in a region between the display region DA and the switching circuit SWS illustrated in FIG. 11, the dummy pixels PXd described with reference to FIG. 9 and FIG. 10 are connected. More specifically, as illustrated in FIG. 12, the number of the dummy pixels PXd connected to the video signal line SLd2 is larger than the number of the dummy pixels PXd connected to the video signal line SLd1. Focusing on a part overlapping with the display region DA, the number of the pixels PX connected to the video signal line SLd2 is smaller than the number of the pixels PX connected to the video signal line SLd1. Accordingly, since the dummy pixel PXd is connected to the video signal line SLd2, it is possible to reduce the difference between the total numbers of the pixels PX and the dummy pixels PXd connected to each of the video signal lines SL. Note that, in the example illustrated in FIG. 12, the dummy pixel PXd is not connected to the video signal line SLd1. However, as a modification of FIG. 12, it is also possible to connect the dummy pixel PXd to the video signal line SLd1.

Figure 13:
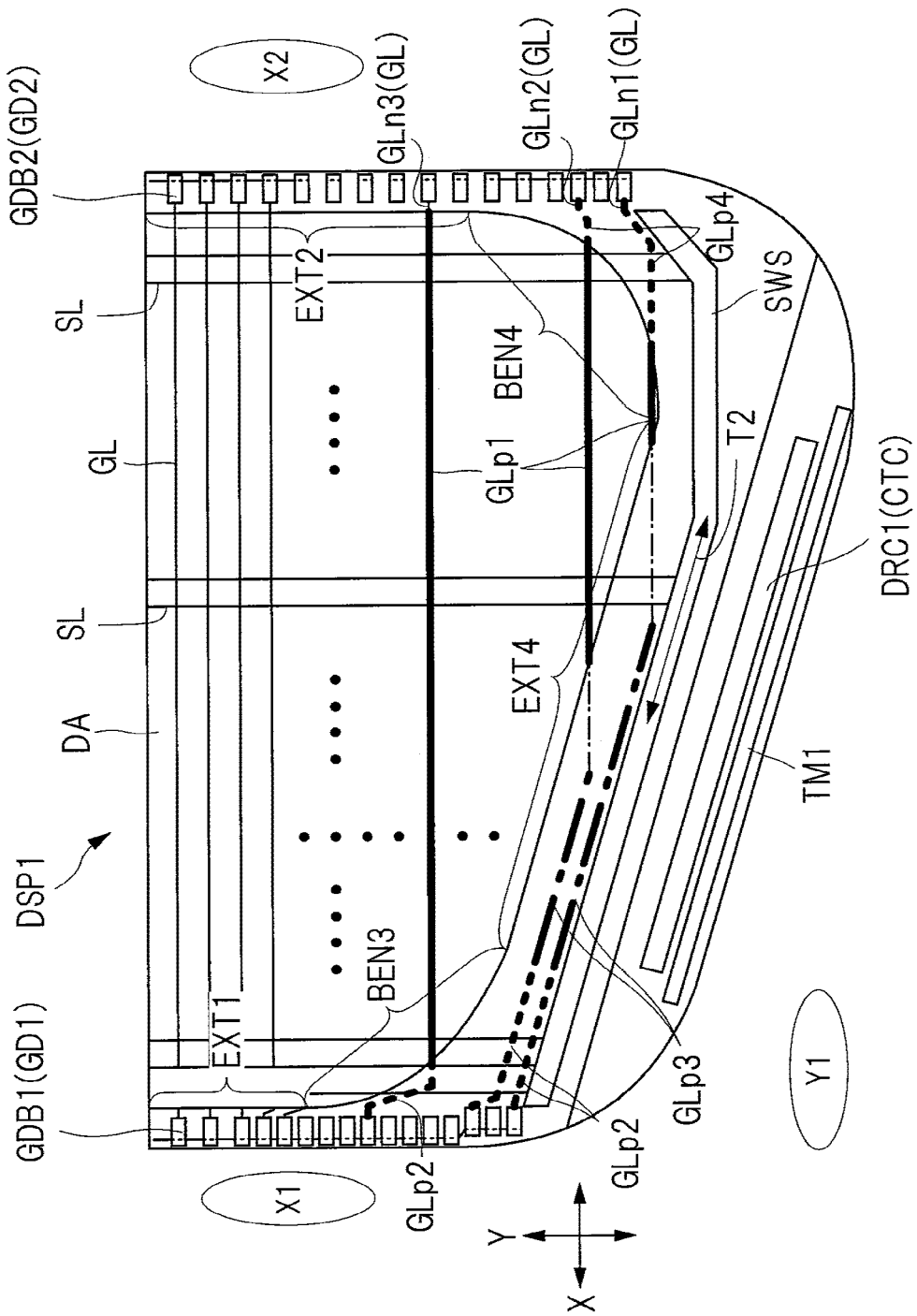
FIG. 13 is an enlarged plan view illustrating by extracting a part of a plurality of scanning signal lines and a part of a plurality of video signal lines illustrated in FIG. 11.

Also, as illustrated in FIG. 11, in the region between the display region DA and the switching circuit SWS, a part of the scanning signal lines GL is drawn out toward the Y1 side from a connecting position thereof with the circuit block GDB1. Then, the scanning signal line GL extends along the outer edge portion (outer periphery side) of the display region DA. Also, in this region, since an arrangement pitch of the plurality of circuit blocks GDB1 is narrow, there is a region in which an arrangement density of the scanning signal lines GL is locally high (in the vicinity of the region overlapping with the bent portion BEN3). As illustrated in FIG. 11, the scanning signal lines GL has a part orthogonally crossing the plurality of video signal lines SL and a part crossing the plurality of video signal lines SL at an angle other than the right angle, in plan view, in the region between the display region DA and the switching circuit SWS. Then, in the part of the plurality of scanning signal lines GL crossing the plurality of video signal lines SL at an angle other than the right angle, the arrangement density of the scanning signal lines GL is relatively high. The wiring layout illustrated in FIG. 11 may be described as follows. FIG. 13 is an enlarged plan view illustrating by extracting a part of the plurality of scanning signal lines and a part of the plurality of video signal lines illustrated in FIG. 11. In FIG. 13, to identify and distinguish between parts constituting the scanning signal lines GL, a different line type is used for each of the parts. A wiring portion (main wiring portion) GLp1 is indicated with a bold line, a wiring portion (first wiring portion) GLp2 and a wiring portion (third wiring portion) GLp4 are indicated with bold dotted lines, and a wiring portion (second wiring portion) GLp3 is indicated with a bold alternate long and short dash line.

As illustrated in FIG. 13, the plurality of scanning signal lines GL include a scanning signal line (first scanning signal line) GLn1 and a scanning signal line (second scanning signal line) GLn2, which go through the region between the switching circuit SWS and the display region DA. Each of the scanning signal line GLn1 and the scanning signal line GLn2 includes the wiring portion GLp1 within the display region DA, the wiring portion GLp2 overlapping with the bent portion BEN3, the wiring portion GLp3 overlapping with the extension portion EXT4 and extending along the direction T2, and the wiring portion GLp4 overlapping with the bent portion BEN4. Since the scanning signal lines GL, which go through the region between the switching circuit SWS and the display region DA, are curved corresponding to a shape of the outer edge of the display region DA, it is possible to use the both-side driving method also on the Y1 side of the display region DA.

Also, in plan view, the number of the plurality of video signal lines SL crossed by the scanning signal line GLn1 is equal to the number of the plurality of video signal lines SL crossed by the scanning signal line GLn2. However, within the display region DA, the number of the plurality of video signal lines SL crossed by the scanning signal line GLn1 is different from the number of the plurality of video signal lines SL crossed by the scanning signal line GLn2. In this way, by making the number of the video signal lines SL crossed by each of the plurality of scanning signal lines GL equal, it is possible to make a load given to the scanning signal lines GL even. Also, by making the number of the plurality of scanning signal lines GL crossed by the plurality of video signal lines SL equal, it is possible to make a load given to the video signal lines SL even.

The display region DA is a trapezoid, and the peripheral region SA (see FIG. 1) is disposed so as to surround a periphery of the trapezoidal display region DA. Accordingly, in the Y direction, an end of the extension portion EXT2 (a border with the bent portion BEN4) is closer to the Y1 side than an end of the extension portion EXT1 (a border with the bent portion BEN3). In this case, as illustrated in FIG. 13, among the plurality of scanning signal lines GL, there is one overlapping with the bent portion BEN3 but not overlapping with the extension portion EXT4 or the bent portion BEN4. In other words, among the plurality of scanning signal lines GL, there is a scanning signal line (third scanning signal line) GLn3 having no wiring portion GLp3, which extends along the direction T2. Still in other words, the scanning signal line GLn3 going through the region between the switching circuit SWS and the display region DA has the wiring portion GLp1 and the wiring portion GLp2 but does not have the wiring portion GLp3 or the wiring portion GLp4.

Also, in a part where the arrangement density of the scanning signal lines GL is high as illustrated in FIG. 11, it is difficult to arrange the dummy pixel PXd illustrated in FIG. 12 at high density. Accordingly, as illustrated in FIG. 14, in the region between the display region DA and the switching circuit SWS, there are a plurality of regions having a different arrangement density of the dummy pixel PXd.

Figure 14:
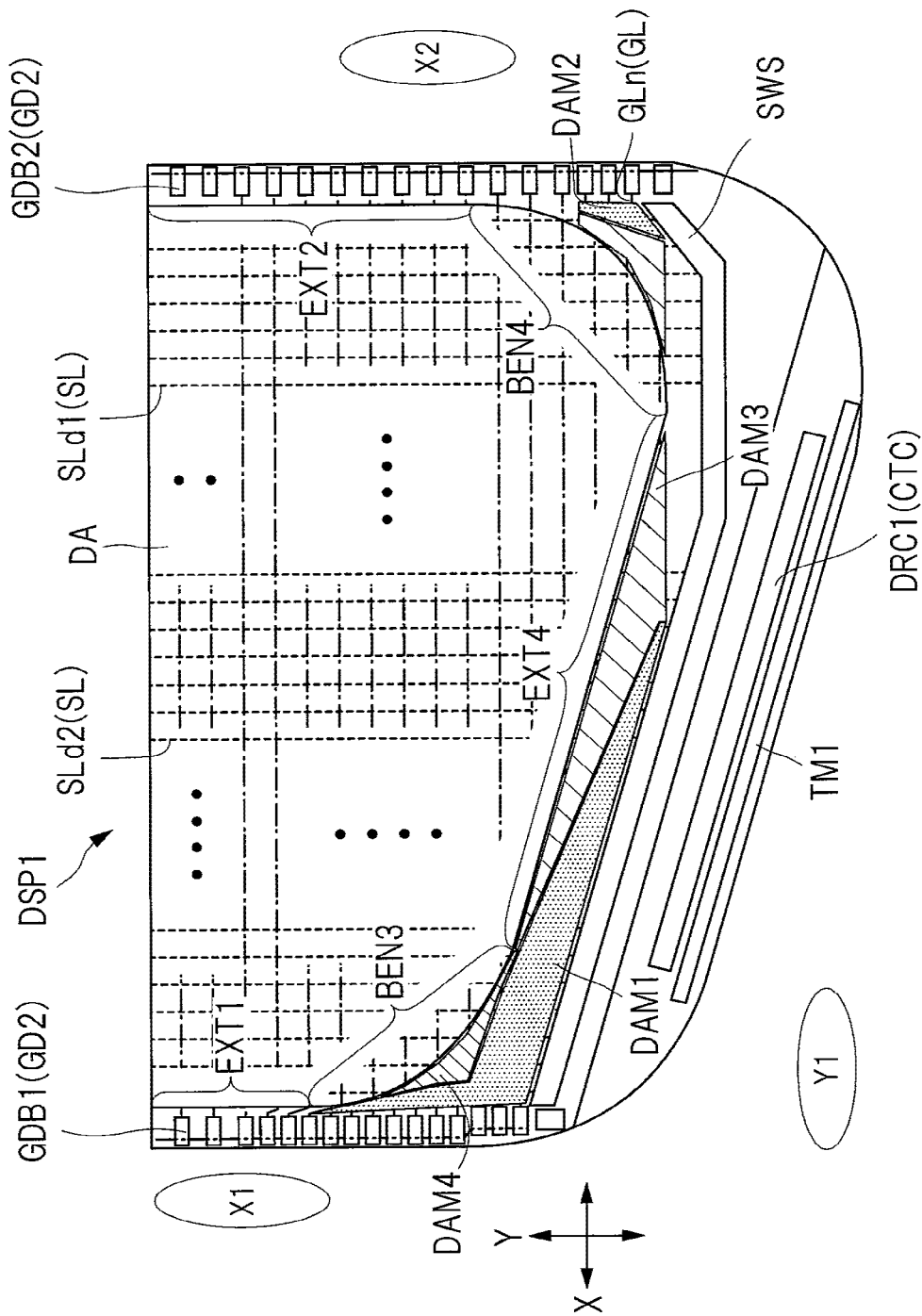
FIG. 14 is a plan view schematically illustrating a region with a high arrangement density of dummy pixels and a region with a low arrangement density thereof in the region between the display device and the switching circuit illustrated in FIG. 11.

FIG. 14 is a plan view schematically illustrating a region with a high arrangement density of the dummy pixels and a region with a low arrangement density thereof in the region between the display device and the switching circuit illustrated in FIG. 11. In FIG. 14, so as to make each of the regions easy to identify, a region having a high arrangement density of the dummy pixels PXd is hatched, and a region having a low arrangement density of the dummy pixels PXd is dot-patterned.

As illustrated in FIG. 14, a direction orthogonal to the Y direction (first direction) is referred to as the X direction (second direction), and one side in the X direction is referred to as an X1 side (first side) and the other side therein is referred to as the X2 side (second side). At this time, in the region between the switching circuit SWS and the display region DA within the peripheral region SA (see FIG. 1), there are a region (first region) DAM1 on the X1 side, a region (second region) DAM2 on the X2 side, and a region (third region) DAM3 between the region DAM1 and the region DAM2. Here, the arrangement density of the dummy pixels PXd in the region DAM3 (see FIG. 12) is higher than each of the arrangement density of the dummy pixels PXd in the region DAM1 and the arrangement density of the dummy pixels PXd in the region DAM2.

A configuration illustrated in FIG. 14 may also be described as follows. That is, for the number of the dummy pixels PXd (see FIG. 12) connected to each of the plurality of video signal lines SL, the number thereof is larger in the region DAM3 than the number thereof in each of the region DAM1 and the region DAM2. In this embodiment, as described above, some of the plurality of scanning signal lines GL are arranged at the high density. Accordingly, it is possible to drive each of the plurality of scanning signal lines GL by the both-side driving method. Also, in a region in which the scanning signal lines GL are disposed at high density, it is difficult to arrange the dummy pixels PXd illustrated in FIG. 12. However, by arranging the dummy pixels PXd in the region DAM3, it is possible to reduce the variation in in-plane distribution of the load given to the pixel PX.

Also, in the example illustrated in FIG. 14, in the peripheral region SA (see FIG. 1), there is a region (fourth region) DAM4 overlapping with the bent portion BEN3 and located between the region DAM1 and the display region DA. The arrangement density of the dummy pixels PXd (see FIG. 12) in the region DAM4 is higher than each of the arrangement density of the dummy pixels PXd in the region DAM1 and the arrangement density of the dummy pixels PXd in the region DAM2.

Figure 15:
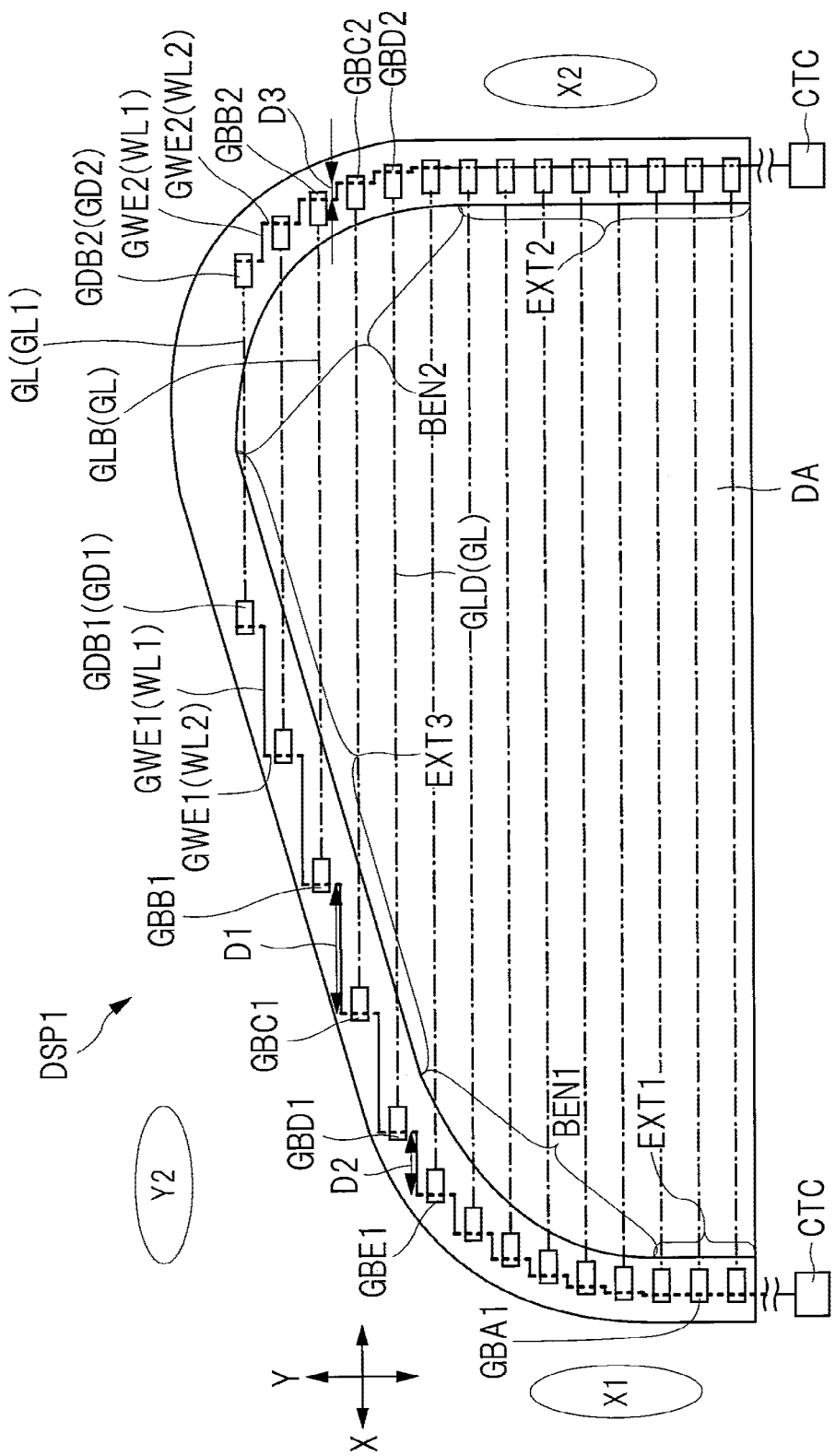
FIG. 15 is an enlarged plan view illustrating an exemplary layout of wirings supplying a potential to the scanning signal lines in the same part as the display device illustrated in FIG. 8.

Next, as another method for reducing variation in in-plane distribution of the load given to the pixel PX, a method for devising a layout of the enable line GWE (see FIG. 6) supplying a potential to the scanning signal line GL will be described. Note that the technique described below may be applied together with the above-described method for using the dummy pixel PXd (see FIG. 9) arranged in the peripheral region SA (see FIG. 9). Also, the technique described below may also be independently applied without implementing the above-described method for using the dummy pixel PXd. FIG. 15 is an enlarged plan view illustrating an exemplary layout of wirings supplying a potential to the scanning signal lines in the same part as the display device illustrated in FIG. 8. In FIG. 15, for each of enable lines GWE1 and GWE2, a part formed in the wiring layer WL1 illustrated in FIG. 2 is denoted by a solid line, and apart formed in the wiring layer WL2 or the wiring layer WL3 is denoted by a dotted line.

As described with reference to FIG. 2, the display device DSP1 includes the wiring layer (first wiring layer) WL1, and the wiring layer (second wiring layer) WL2 made of a material having lower resistivity than that of the wiring layer WL1. A conductor pattern formed in the wiring layer WL1 is made of, for example, metal such as chrome (Cr), titanium (Ti), and molybdenum (Mo), or an alloy thereof. The conductor pattern formed in the wiring layer WL2 is made of a metal film having a multilayer structure, for example, in which aluminum (Al) is sandwiched with molybdenum (Mo), titanium (Ti), or the like. In this case, resistivity (specific resistance) of the wiring layer WL1 is higher than specific resistance of the wiring layer WL2. As illustrated in FIG. 2, the scanning signal lines GL are formed in the wiring layer WL1.

Also, as illustrated in FIG. 15, the display device DSP1 includes the enable line (first potential supply line) GWE1 supplying the potential as the scanning signal Gsi (see FIG. 6) to the scanning signal lines GL via the driving circuit GD1. In plan view, the enable line GWE1 overlaps with each of the extension portion EXT1, the bent portion BENT, and the extension portion EXT3. The enable line GWE1 goes through the wiring layer WL1 and the wiring layer WL2 in a region overlapping with the extension portion EXT3. Considering only from a viewpoint of reducing wiring resistance of the enable line GWE1, the enable line GWE1 does not go through the wiring layer WL1, preferably. However, as illustrated in FIG. 15, since a part of the enable line GWE1 is formed in the wiring layer WL1, an in-plane difference of a time constant (gate time constant) among the plurality of scanning signal lines GL can be reduced.

For example, in the example illustrated in FIG. 15, a length of the scanning signal line GLB connected to the circuit block GBB1 of the driving circuit GD1 and to a circuit block GBB2 of the driving circuit GD2 is shorter than a length of a scanning signal line GLD connected to a circuit block GBD1 of the driving circuit GD1 and to a circuit block GBD2 of the driving circuit GD2. In this case, a resistance value of the scanning signal line GLB is lower than a resistance value of the scanning signal line GLD. However, in a case where a part of the enable line GWE1 supplying a potential to the scanning signal line GLB is formed in the wiring layer WL1 having a high resistance value, the resistance value of the part of the enable line GWE1 formed in the wiring layer WL1 becomes high. Accordingly, considering an entire supply path of the potential as the scanning signal Gsi, a difference in resistance value of each of a plurality of transmission paths can be reduced. As a result, it is possible to reduce the in-plane difference of the time constant. That is, difference in resistance value between the scanning signal line GLB and the scanning signal line GLD is reduced due to the enable line GWE1 going through the wiring layer WL1 between the circuit block GBD1 and the circuit block GBB1.

Also, in the example illustrated in FIG. 15, the display device DSP1 includes the enable line (second potential supply line) GWE2 supplying the potential as the scanning signal Gsi to the scanning signal lines GL via the driving circuit GD2. In plan view, the enable line GWE2 overlaps with each of the extension portion EXT2 and the bent portion BEN2. The enable line GWE2 goes through the wiring layer WL1 and the wiring layer WL2 in a region overlapping with the bent portion BEN2. In the case of the enable line GWE2, since the enable line GWE2 does not overlap with the extension portion EXT3, a length of apart of the enable line GWE2 formed in the wiring layer WL1 is shorter than that of the enable line GWE1. Accordingly, an effect of preventing variation in time constant due to the part of the enable line GWE2 formed in the wiring layer WL1 is higher in the enable line GWE1. However, in a case where each of the enable line GWE1 and the enable line GWE2 goes through both of the wiring layer WL1 and the wiring layer WL2, the effect of preventing variation in time constant is especially high.

Also, in the region overlapping with the extension portion EXT1, the enable line GWE1 goes through the wiring layer WL2 but not through the wiring layer WL1. Similarly, in the region overlapping with the extension portion EXT2, the enable line GWE2 goes through the wiring layer WL2 but not through the wiring layer WL1. A length of each of the plurality of scanning signal lines GL connecting the extension portion EXT1 to the extension portion EXT2 is designed to be the same (although there may be a small difference due to processing accuracy and the like). The length of each of the plurality of scanning signal lines GL connecting the extension portion EXT1 to the extension portion EXT2 is the longest among the plurality of scanning signal lines GL provided in the display device DSP1. Thus, in such regions, it is not possible to obtain the effect of reducing variation in time constant even by increasing the resistance value of the path for supplying the potential. Also, in these regions, in a case where the resistance value of the path for supplying the potential is high, each resistance value of the scanning signal lines GL (for example, the scanning signal line GL1 and the like) connecting the extension portion EXT3 to the bent portion BEN2 becomes large accordingly. Thus, in the region overlapping with the extension portion EXT1 and in the region overlapping with the extension portion EXT2, it is preferred that the resistance values of the enable line GWE1 and the enable line GWE2 be reduced.

Also, the driving circuit GD1 includes the circuit block (first B circuit block) GBB1, a circuit block (first C circuit block) GBC1, the circuit block (first D circuit block) GBD1, and a circuit block (first E circuit block) GBE1. In the example illustrated in FIG. 15, the circuit block GBB1 and the circuit block GBC1 overlap with the extension portion EXT3, and the circuit block GBD1 and the circuit block GBE1 overlap with the bent portion BEN1. The enable line GWE1 goes through the wiring layer WL1 at a distance (first distance) D1 between the circuit block GBB1 and the circuit block GBC1. Also, the enable line GWE1 goes through the wiring layer WL1 at a distance (second distance) D2 between the circuit block GBD1 and the circuit block GBE1. The distance D2 is shorter than the distance D1.

Also, the driving circuit GD2 includes the circuit block (second A circuit block) GBB2, and a circuit block (second B circuit block) GBC2. In the example illustrated in FIG. 15, the circuit block GBB2 and the circuit block GBC2 overlap with the bent portion BEN2, and the circuit block GBD1 and the circuit block GBE1 overlap with the bent portion BEN1. The enable line GWE2 goes through the wiring layer WL1 at a distance (third distance) D3 between the circuit block GBB2 and the circuit block GBC2. The distance D1 is longer than the distance D3.

Each of the plurality of scanning signal lines GL extends along the X direction. Accordingly, when the part formed in the wiring layer WL1, of the enable lines GWE1 and GWE2, extends along the X direction, it is easy to make the resistance value of the plurality of signal transmission paths (a wiring path distance including the enable line GWE and the scanning signal line GL) even. A length of the extension portion EXT3 in the X direction is longer than lengths of the bent portion BEN1 and the bent portion BEN2 in the X direction. Thus, in the region overlapping with the extension portion EXT3, compared to the regions overlapping with the bent portions BEN1 and BEN2, it is possible to make a wiring length in the X direction longer. Thus, as illustrated in FIG. 15, in a case where the distance D1 is longer than the distance D2 and the distance D3, it is easy to make the resistance value of the plurality of signal transmission paths even.

Figure 16:
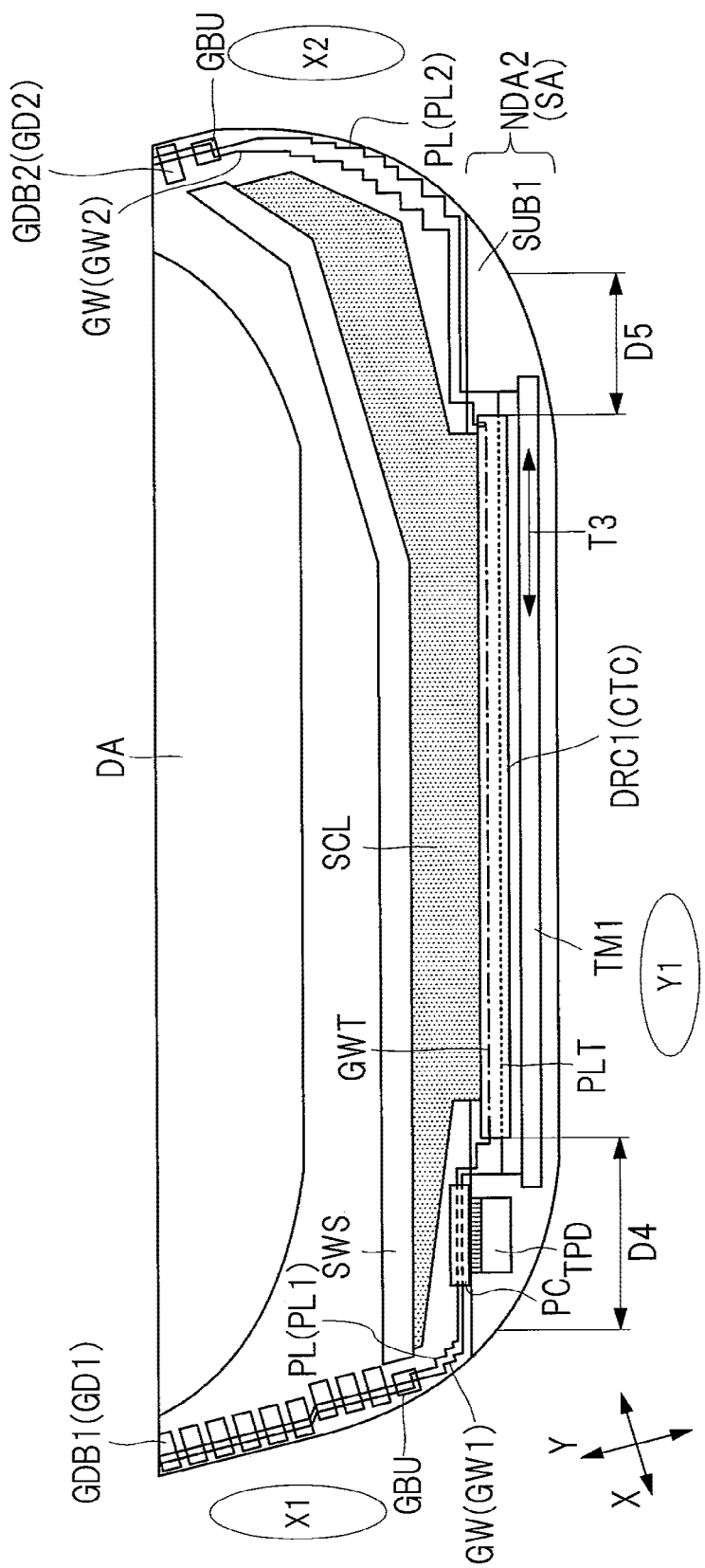
FIG. 16 is a plan view schematically illustrating an outline of a circuit layout in a periphery of a driver chip illustrated in FIG. 1.
Figure 17:
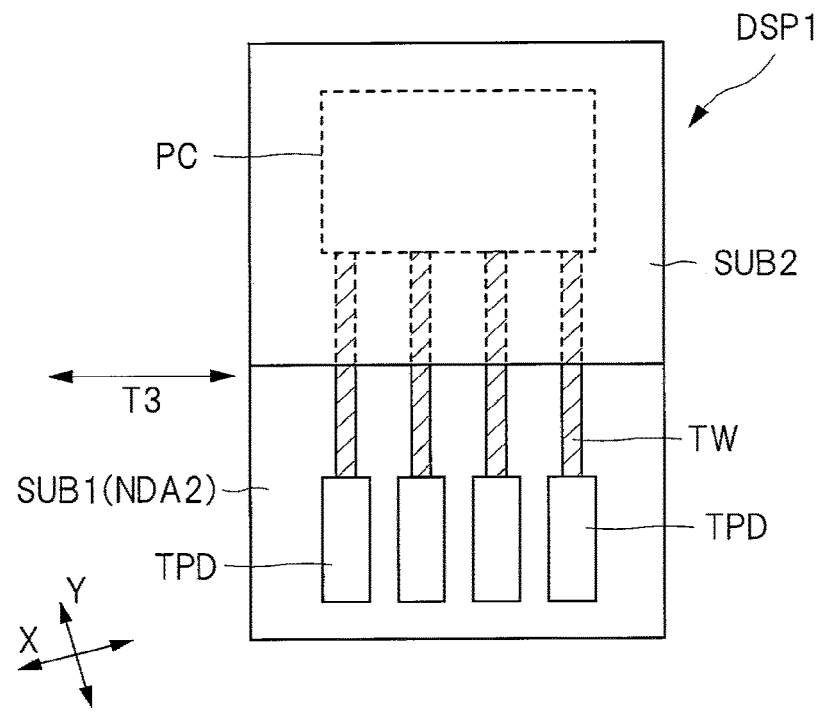
FIG. 17 is an enlarged plan view illustrating a periphery of a terminal for inspection and a protection circuit of the circuit layout illustrated in FIG. 16.
Figure 18:
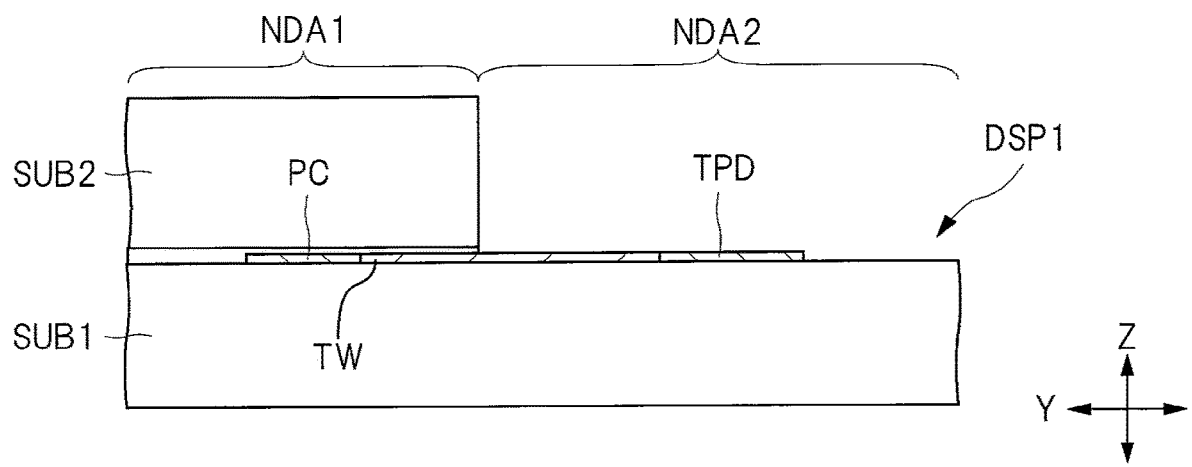
FIG. 18 is an enlarged cross-sectional view illustrating the periphery of the terminal for inspection and the protection circuit illustrated in FIG. 17.
Figure 19:
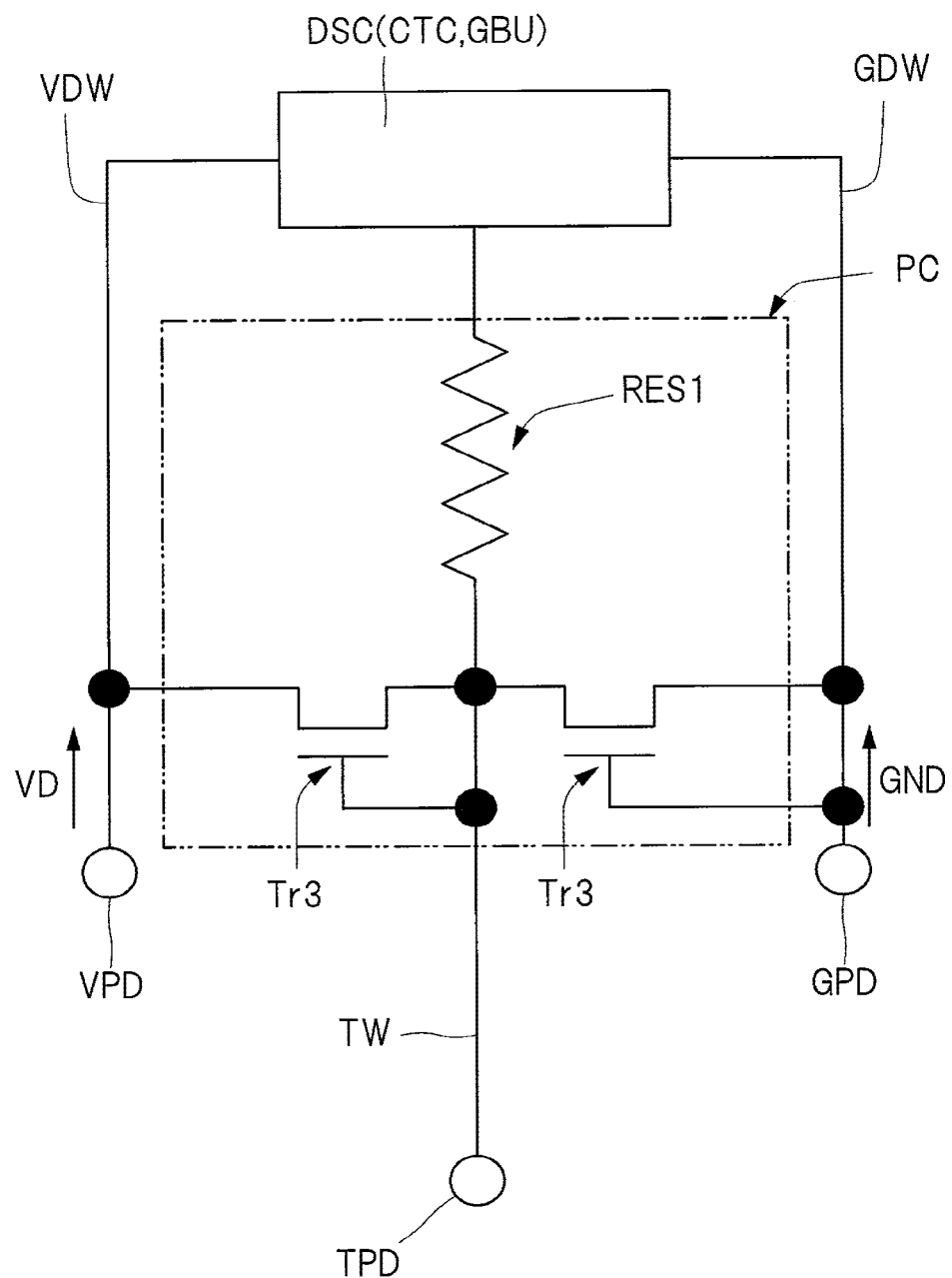
FIG. 19 is an equivalent circuit diagram illustrating an exemplary configuration of the protection circuit illustrated in FIGS. 17 and 18.
Figure 20:
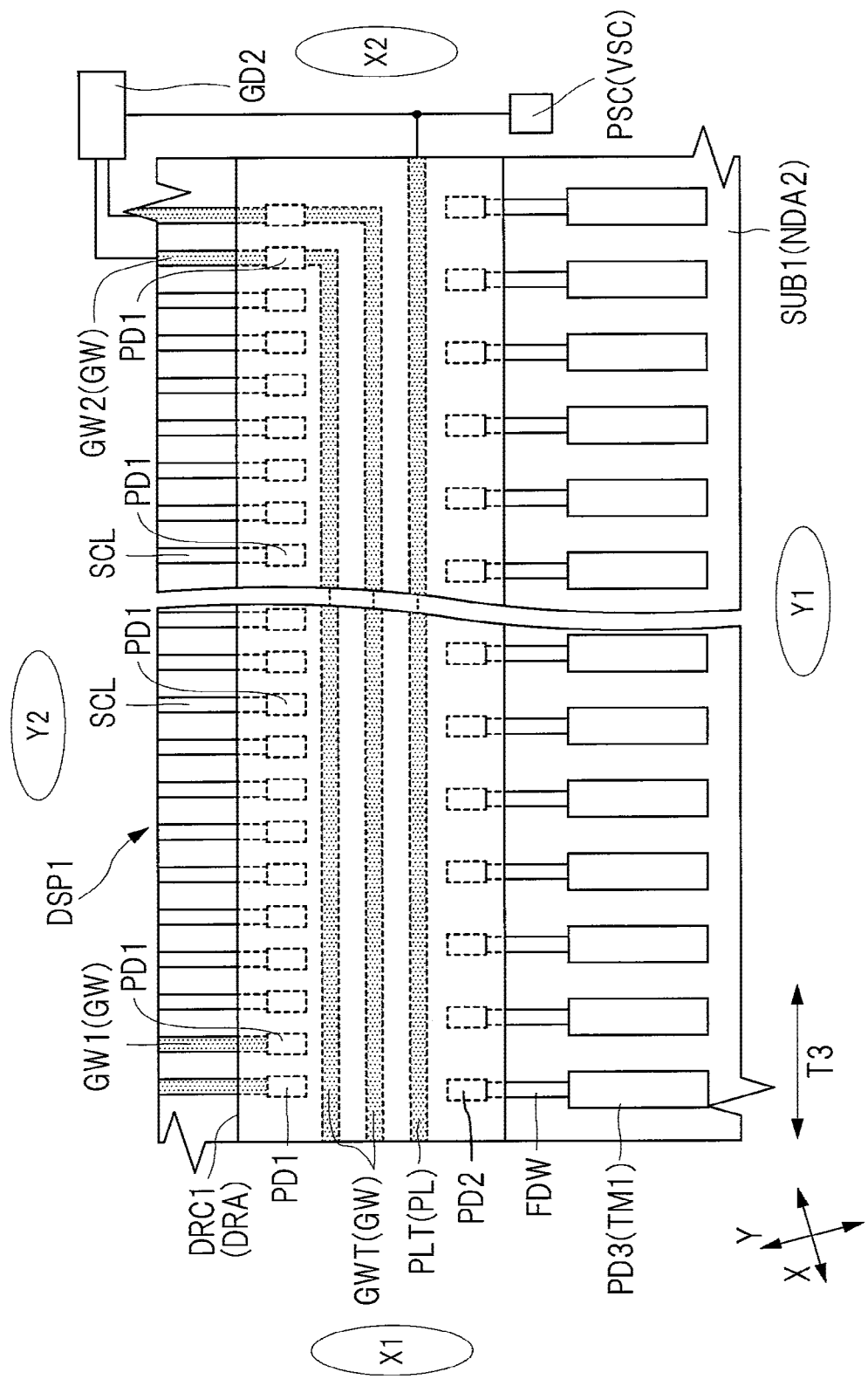
FIG. 20 is an enlarged plan view illustrating a wiring layout in the periphery of the driver chip illustrated in FIG. 16.

Next, a circuit layout in the region NDA2 illustrated in FIG. 1 will be described. FIG. 16 is a plan view schematically illustrating an outline of a circuit layout in a periphery of the driver chip illustrated in FIG. 1. FIG. 17 is an enlarged plan view illustrating a periphery of a terminal for inspection and a protection circuit of the circuit layout illustrated in FIG. 16. FIG. 18 is an enlarged cross-sectional view illustrating the periphery of the terminal for inspection and the protection circuit illustrated in FIG. 17. FIG. 19 is an equivalent circuit diagram illustrating an exemplary configuration of the protection circuit illustrated in FIGS. 17 and 18. FIG. 20 is an enlarged plan view illustrating a wiring layout in the periphery of the driver chip illustrated in FIG. 16. In FIG. 20, each of wirings and terminals provided in a position overlapping with the driver chip DRC1 is indicated with a dotted line. Also, in FIG. 20, to visually indicate a distinction between a wiring GWT and a wiring PLT, and another wiring (for example, the video signal connecting lines SCL), a dotted pattern is added to each of the control wiring GW, the wiring GWT, and the wiring PLT.

There is a trend that a display device having a large area occupying ratio of the display region DA (see FIG. 1) to the entire device is more preferred. Accordingly, it is preferred that a width (area) of the peripheral region SA (see FIG. 1) around the display region DA be small as possible. A region with the largest width of the peripheral region SA illustrated in FIG. 1 is a region closer to the Y1 side than the display region DA in the Y direction. For example, in the Y direction, the width (length in the Y direction) of the peripheral region SA between an outer edge end on the Y1 side and the display region DA is larger than a width (length in the Y direction) of the extension portion EXT3 illustrated in FIG. 1. Also, the width of the peripheral region SA between the outer edge end on the Y1 side and the display region DA is larger than a width (length in the X direction) of each of the extension portions EXT1 and EXT2 in the X direction.

Accordingly, to increase the area occupying ratio of the display region DA to the entire display device DSP1, it is important to improve efficiency of a circuit layout in the peripheral region SA closer to the Y1 side than the display region DA. Accordingly, in the display device DSP1, the present inventor has considered a technique for improving the efficiency of the circuit layout between the terminal portion TM1, in which a group of external terminals to be connected to an external device are arrayed, and the display region DA. For example, the present inventor has considered an improvement of efficiency of a layout of a terminal TPD for inspection and a protection circuit PC to be connected to the terminal TPD for inspection illustrated in FIG. 16.

As illustrated in FIG. 17, the display device DSP1 includes a plurality of terminals (first terminals) TPD. The terminals TPD are inspection terminals used in a testing step performing an electrical test of various circuits provided in the display device DSP1 during manufacturing process of the display device DSP1 or after completion of the display device DSP1. As illustrated in FIG. 16, the terminals TPD are connected to the control wiring GW controlling the driving circuit GD1. The control wiring GW is a signal transmission path transmitting a control signal to each of the driving circuits GD1 and GD2 and is also a wiring for inspection used in performing an electrical test of each of the driving circuits GD1 and GD2. Accordingly, it is possible to perform the electrical test of each of the driving circuits GD1 and GD2 via the terminals TPD.

Note that one control wiring GW is illustrated in FIG. 16; however, as illustrated in FIG. 6 described above, the plurality of control wirings GW are connected to the control circuit CTC. The plurality of control wirings GW include the clock line GWC, the enable signal ENB, and the start pulse line GWS.

Also, as illustrated in FIG. 18, each of the plurality of terminals TPD is formed on the substrate SUB1 and is exposed from the substrate SUB2. Accordingly, it is possible to perform an inspection in a state where the substrate SUB1 and the substrate SUB2 overlap with each other.

In a case where a terminal such as the terminal TPD in a state of being exposed from the substrate SUB2 is connected to an internal circuit of the display device DSP1, it is preferred that a countermeasure against electrostatic discharge (ESD) to the internal circuit be considered. Accordingly, a protection circuit (first circuit) PC is connected between each of the plurality of terminals TPD illustrated in FIG. 17 and the internal circuit (for example, the driving circuit) of the display device DSP1.

The protection circuit PC is a bypass circuit bypassing and discharging a surge current applied from the outside caused by the electrostatic discharge and the like, to the outside, to protect the internal circuit from being destroyed or malfunctioning. In the example illustrated in FIG. 19, the protection circuit PC includes a transistor Tr3 and a resistance RES1. More specifically, the resistance RES1 is connected between a wiring TW connected to the terminal TPD, and an internal circuit DSC. Also, the transistor Tr3 is connected between the wiring TW and a wiring GDW to which a reference potential GND is supplied, and the transistor Tr3 is connected between the wiring TW and a wiring VDW to which a power supply potential VD is supplied. In the example illustrated in FIG. 19, the surge current applied to the terminals TPD is discharged to a terminal GPD or a terminal VPD via the transistor Tr3. Accordingly, it is possible to prevent the surge current from flowing into the internal circuit DSC and to prevent destruction and malfunction of the internal circuit DSC.

Note that FIG. 19 is one exemplary configuration of the protection circuit PC, and there are various modifications of a structure of the protection circuit PC. For example, it is also possible to connect a not-illustrated diode to the terminals TPD in place of the transistor Tr3 illustrated in FIG. 19. Also, there are various modifications of the number of the resistances RES1 and the transistors Tr3 (or the diodes) as well as connecting positions thereof in addition to the example illustrated in FIG. 19. For example, in a case where potential of a surge voltage applied is already known, only either one of two transistors Tr3 illustrated in FIG. 19 may be connected to the terminal TPD. Also, it is also possible that three or more transistors Tr3 are connected to one terminal TPD.

Also, as illustrated in FIG. 18, the peripheral region SA of the substrate SUB1 includes a region NDA1 covered with the substrate SUB2, and the region NDA2 exposed from the substrate SUB2. The protection circuit PC is disposed in the region NDA1. In other words, as illustrated in FIG. 18, the protection circuit PC is located between the substrate SUB1 and the substrate SUB2. Accordingly, it is possible to prevent the electrostatic discharge from being directly applied to the protection circuit PC. However, in a case where the protection circuit PC is disposed in the region NDA1, it is necessary to improve the efficiency of the circuit layout in the region NDA1.

Accordingly, as illustrated in in FIG. 16, in the display device DSP1, each of the plurality of terminals TPD used for inspection is disposed on the Y1 side of the display region DA and on the X1 side of the driver chip DRC1 in which the control circuit CTC is formed. Also, the protection circuit PC connected to the terminals TPD is disposed on the Y1 side of the display region DA and on the X1 side of the driver chip DRC1 in which the control circuit CTC is formed. In contrast, on the Y2 side of the display region DA (see FIG. 1) and on the X2 side of the driver chip DRC1, there is neither the terminal TPD nor the protection circuit PC. In a case where there are the driving circuits GD on both of the X1 side and the X2 side in the X direction as in this embodiment, it is also possible to use a method in which the terminal TPD for inspection and the protection circuit PC are disposed on both of the X1 side and the X2 side. However, as in this embodiment, by intensively disposing the terminals TPD for inspection and the protection circuit PC on either of the X1 side and the X2 side, it is possible to improve the efficiency of the circuit layout connected to the terminals TPD.

Comparing the region of the driver chip DRC1 on the X1 side with the region of the driver chip DRC1 on the X2 side, there is more space in the region on the X1 side. As in this embodiment, in a case where it is the trapezoid, at both ends of a side connecting a short side and a long side that are in parallel with each other, an angle formed by the side and the short side is an obtuse angle, and an angle formed by the side and the long side is an acute angle. For example, in FIG. 1, an angle formed by an extended line of the extension portion EXT1 and an extended line of the extension portion EXT4 is an obtuse angle. Also, an angle formed by an extended line of the extension portion EXT2 and the extended line of the extension portion EXT4 becomes an acute angle. In this case, as illustrated in FIG. 16, in the direction T3, which is an extension direction of the driver chip DRC1, a distance D4 which is from an end of the driver chip DRC1 on the X1 side to an outer edge side of the substrate SUB1 on the X1 side is longer than a distance D5 from an end of the driver chip DRC1 on the X2 side to an outer edge side of the substrate SUB1 on the X2 side.

In this way, comparing the region of the driver chip DRC1 on the X1 side with the region of the driver chip DRC1 on the X2 side, in a case where there is more space in the region on the X1 side, by disposing the terminals TPD for inspection and the protection circuit PC on the X1 side of the driver chip DRC1, it is possible to prevent an area of the peripheral region SA from increasing due to disposing of the terminals TPD for inspection and the protection circuit PC.

As illustrated in FIG. 16, each of the plurality of terminals TPD is on an extension line of the driver chip DRC1 along the direction T3. As illustrated in FIG. 17, each of the plurality of terminals TPD is arrayed along the direction T3, which is an extension direction of a long side of the driver chip DRC1 (see FIG. 16).

Also, as described above, the display device DSP1 includes, in the X direction, the driving circuit GD1 on the X1 side and the driving circuit GD2 on the X2 side. To gather the plurality of terminals TPD to one place, the control wiring GW connecting each of the terminals TPD to each of the plurality of driving circuits GD1 and GD2 is necessary. Accordingly, the control wiring GW includes a control wiring (first control wiring) GW1 transmitting a control signal to the driving circuit GD1, and a control wiring (second control wiring) GW2 transmitting a control signal to the driving circuit GD2. The control wiring GW1 is connected to the driver chip DRC1, the driving circuit GD1, and the terminals TPD. The control wiring GW2 is connected to the driver chip DRC1 and the driving circuit GD2. As illustrated in FIG. 16, the terminals TPD are disposed on the X1 side of the driver chip DRC1. Accordingly, a path for electrically connecting the control wiring GW2 to the terminals TPD for inspection is necessary. Accordingly, as the wiring path connecting the control wiring GW2 to the terminals TPD, the display device DSP1 includes a wiring (first inspection wiring) GWT (a part indicated with an alternate long and short dash line at a position overlapping with the driver chip DRC1) illustrated in FIGS. 16 and 20. The wiring GWT overlaps with the driver chip DRC1 in plan view and is extended along the direction T3. The control wiring GW2 is electrically connected to the terminals TPD via the wiring GWT.

Also, in a case of the display device DSP1, the power supply wiring PL supplying the power supply potential to the driving circuit GD is connected to the terminals TPD via the protection circuit PC. As described with reference to FIG. 6, the power supply wiring PL includes the wiring PLH to which the potential VDH is supplied, and the wiring PLL to which a potential lower than the potential VDH is supplied. The power supply wiring PL is connected to each of the plurality of driving circuits GD1 and GD2. Accordingly, the power supply wiring PL includes a power supply wiring (first power supply wiring) PL1 transmitting the power supply potential to the driving circuit GD1, and a power supply wiring (second power supply wiring) PL2 transmitting the power supply potential to the driving circuit GD2. The power supply wiring PL1 is connected to the driving circuit GD1 and the terminals TPD. The power supply wiring PL2 is connected to the driving circuit GD2. Also, as a wiring path connecting the power supply wiring PL2 to the terminals TPD, the display device DSP1 includes a wiring (second inspection wiring) PLT illustrated in FIGS. 16 and 20 (a part indicated with a dotted line at a position overlapping with the driver chip DRC1). The wiring PLT overlaps with the driver chip DRC1 in plan view and is extended along the direction T3. The power supply wiring PL2 is electrically connected to the terminals TPD via the wiring PLT.

As illustrated in FIG. 20, each of the plurality of terminals PD1 and the plurality of terminals PD2 connected to the driver chip DRC1 is arrayed along the direction T3 that is inclined to each of the Y direction and the X direction. The wiring GWT and the wiring PLT are disposed between the terminals PD1 and the terminals PD2. In other words, the wiring GWT and the wiring PLT traverse the region DRA along the direction T3. Also, as illustrated in FIG. 5, the wiring GWT and the wiring PLT are disposed between the driver chip DRC1 and the substrate SUB1 in a Z direction. The Z direction is a direction vertical to an XY plane containing the X direction and the Y direction illustrated in FIG. 20. Also, on the Y2 side of the terminals PD1, a large number of the video signal connecting lines SCL are disposed. Also, between the terminals PD2 and the terminals PD3, there is disposed the wiring FDW connecting the wiring board FWB1 to the driver chip DRC1. Accordingly, the wiring GWT and the wiring PLT are disposed between the terminals PD1 and the terminals PD2. In a case where the wiring GWT and the wiring PLT for inspection are disposed between the terminals PD1 and the terminals PD2, it is possible to reduce a part where wiring for inspection crosses another wiring. Accordingly, it is possible to reduce an influence of noise from the other wiring on the wiring for inspection. It is also possible to reduce an influence of noise from the wiring for inspection on the other wiring.

Note that, in FIG. 16, to make it easy to see, one wiring GWT and one wiring PLT are indicated at positions where these wirings overlap with the driver chip DRC1. However, the number of the wirings GWT and the number of the wirings PLT are not limited to one and may also be more than one. By providing the plurality of wirings GWT in the region DRA (see FIG. 3) overlapping with the driver chip DRC1, it is possible to increase the types of a signal to be transmitted through the region DRA.

Also, as illustrated in FIG. 20, the control wiring GW does not overlap with each of the plurality of video signal connecting lines SCL in plan view. Accordingly, it is possible to prevent the control wiring GW and the plurality of video signal connecting lines SCL from mutually exerting the influence of noise. As illustrated in FIG. 16, the plurality of video signal connecting lines SCL are located between the control wiring GW and the display region DA. In this case, the control wiring GW is disposed along an outer edge portion of the substrate SUB1, whereby the control wiring GW is bent at multiple places. Each of the plurality of video signal connecting lines SCL is also bent; however, the number of the bent portions of the control wiring GW is larger than the number of the bent portions of each of the video signal connecting lines SCL. In other words, it is possible to reduce the number of the bent portions of each of the video signal connecting lines SCL since each of the video signal connecting lines SCL is disposed between the control wiring GW and the display region DA. Compared to the control wiring GW, the total number of the video signal connecting lines SCL is large. Accordingly, an arrangement pitch of the video signal connecting lines SCL is narrower than an arrangement pitch of the control wirings GW. By reducing the number of the bent portions of each of the video signal connecting lines SCL, it is possible to reduce a part where the arrangement pitch of the video signal connecting lines SCL becomes locally narrow. Accordingly, it is possible to dispose a large number of the video signal connecting lines SCL at a narrow pitch.

In the foregoing, the technique found by the inventor of the present application has been concretely described based on the embodiments by way of example. However, the present invention is not limited to the foregoing embodiments and various modifications and alterations can be made within the scope of the present invention.

For example, in the above-described embodiment, a case of a liquid crystal display device has been exemplified as an exemplary disclosure; however, as another exemplary application, it is possible to list all sorts of flat panel display devices such as an organic EL display device and another light emitting display device as well as an electronic paper display device having an electrophoretic element and the like. Also, it is applicable to any size of display device, from a small-sized display device to a large-sized display device, without any limitation in particular.

In the above-described embodiment, for example, as illustrated in FIG. 3, there has been described the aspect in which both of ends of each of the plurality of scanning signal lines GL are connected to the driving circuit GD1 and the driving circuit GD2 and the display region DA as a whole is driven by the both-side driving method. However, as a modification, it is also possible to drive the display region DA as a whole by the one-side driving method. In this case, for example, no driving circuit GD1 illustrated in FIG. 3 is disposed, and all of the scanning signal lines GL are driven by the driving circuit GD2 by the one-side driving method. It is also possible that each of the plurality of scanning signal lines GL is connected to either one of the driving circuit GD1 and the driving circuit GD2 and not to the other.

Figure 21:
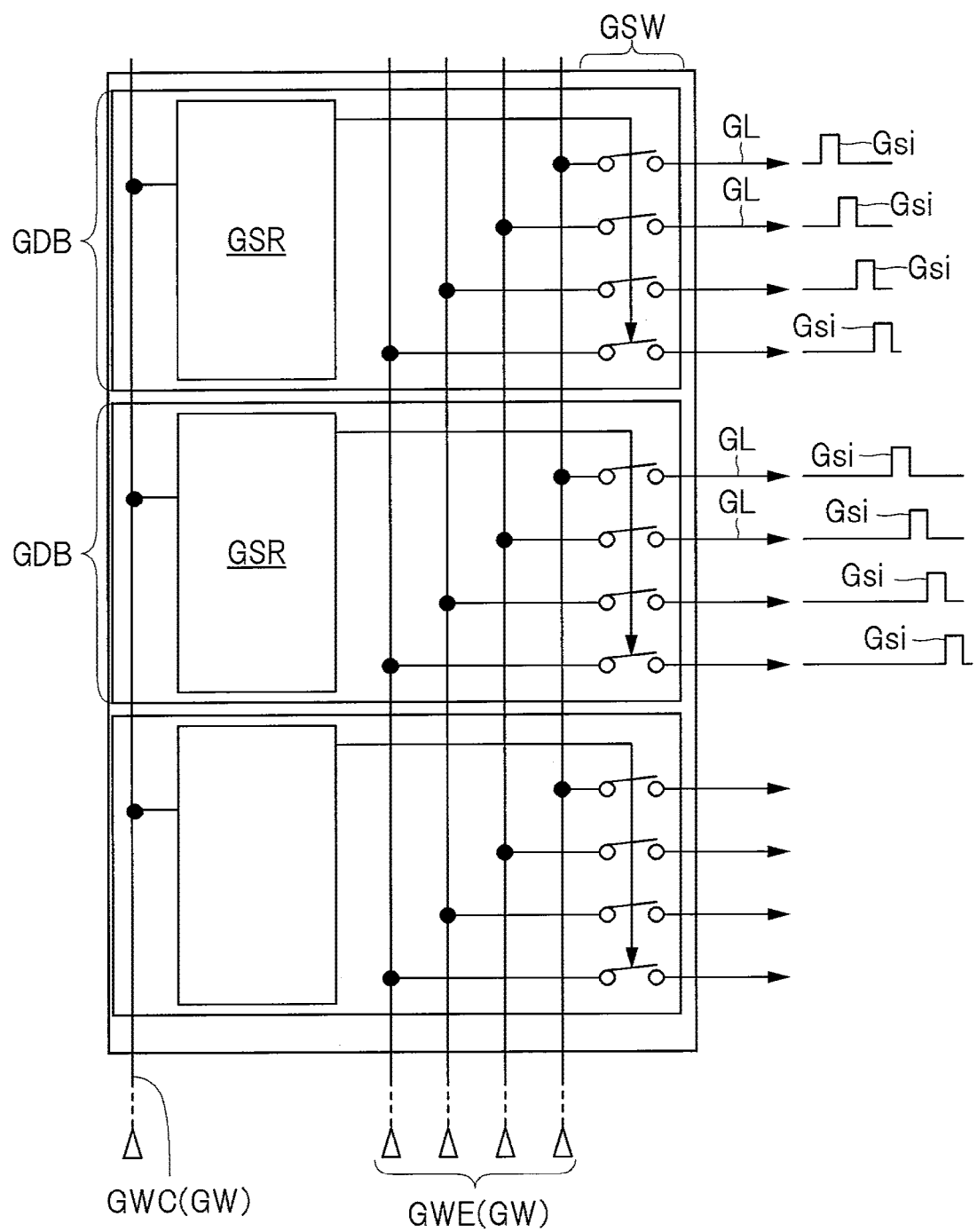
FIG. 21 is a circuit block diagram illustrating a modification of the circuit block illustrated in FIG. 6.

For example, in each of the drawings such as FIG. 6 that illustrates a relation between the driving circuit GD and the scanning signal line GL connected to the driving circuit GD, there has been also described an example in which one scanning signal line GL is connected to each of the circuit blocks GDB in which one switching circuit GSW is connected to one shift register circuit GSR. It is necessary that the switching circuit GSW correspond to the scanning signal line GL on a one-to-one basis; however, as in a modification illustrated in FIG. 21, for example, it is also possible to connect the plurality of switching circuits GSW to one shift register circuit GSR. FIG. 21 is a circuit block diagram illustrating a modification of the circuit block illustrated in FIG. 6. In the example illustrated in FIG. 21, four switching circuits GSW are connected to each of the plurality of shift register circuits GSR. A set of one shift register circuit GSR and four switching circuits GSW constitutes one circuit block. Also, to each of the plurality of switching circuits, one scanning signal line GL is connected.

Also, in the modification illustrated in FIG. 21, each of the enable line GWE independent from each other is connected to each of the switching circuits GSW included in one circuit block GDB. In this case, by combining a pulse signal supplied from the shift register circuit GSR with a pulse signal supplied from the enable line GWE, it is possible to sequentially transmit the scanning signal Gsi (see FIG. 6) to each of the plurality of scanning signal lines GL. In the modification illustrated in FIG. 21, compared to the example described with reference to FIG. 6, it is possible to reduce the number of the shift register circuits GSR. Also, on the assumption that the number of the scanning signal lines GL is the same as that in the example illustrated in FIG. 6, as illustrated in FIG. 21, a configuration in which each of the plurality of scanning signal lines GL is connected to any of the plurality of enable lines GWE independent from each other is advantageous from the following point. That is, since the number of the switching circuits GSW connected to the enable line GWE becomes small (¼) in the example of the drawing, it is possible to reduce a load capacity of the enable lines GWE.

Also, in the above-described embodiment, for example, as illustrated in FIG. 17, the example has been described in which each of the plurality of terminals TPD is connected via the protection circuit PC. However, the protection circuit PC may not be provided in a case where it is not necessary to consider the electrostatic discharge to the internal circuit.

Various modifications and alterations can be conceived by those skilled in the art within the spirit of the present invention, and it is understood that such modifications and alterations are also encompassed within the scope of the present invention.

For example, those skilled in the art can suitably modify the above-described embodiment by addition, deletion, or design change of components, or by addition, omission, or condition change of steps. Such modifications are also encompassed within the scope of the present invention as long as they include the gist of the present invention.

The present invention is effective when applied to an input device and a display device provided with an input detection function.

What is claimed is:

1. A display device comprising:
   a substrate includes a display region and a peripheral region that surrounds the display region;
   a plurality of video signal lines extended to a first direction in the display region;
   a plurality of scanning signal lines extended to a second direction crossing the first direction in the display region;
   a first control circuit supplying a control signal including a clock signal;
   a first driving circuit and a second driving circuit supplying a scanning signal;
   a first clock line connecting the first control circuit to the first driving circuit;
   a second clock line connecting the first control circuit to the second driving circuit; and
   a selection circuit connected to the video signal lines and provided between the display region and the first control circuit,
   wherein the substrate includes a first side and a second side each extending along the first direction, and the substrate includes a third side and a fourth side,
   wherein a length of the second side is longer than a length of the first side, and
   wherein, in a plan view, the first driving circuit is provided along the first side and the third side, the second driving circuit is provided along the second side, and the selection circuit is provided along the fourth side,
   wherein, in a plan view, the second driving circuit is not provided between the selection circuit and the display region,
   wherein the first driving circuit includes a first A circuit block and a first B circuit block connected via the first clock line,
   wherein the first B circuit block is closer to the third side than the first A circuit block,
   wherein the plurality of scanning signal lines include a first A scanning signal line connected to the first A circuit block and a first B scanning signal line connected to the first B circuit block, and
   wherein the first B circuit is provided closer to the display region than the first A circuit.

2. The display device according to claim 1,
   wherein the plurality of video signal lines include a first video signal line and a second video signal line, and
   wherein, in a plan view, a length of the second video signal line from the selection circuit to the display region is longer than a length of the first video signal line from the selection circuit to the display region.

3. The display device according to claim 1, further comprising:
   a first wiring layer;
   a second wiring layer made of a material having resistivity lower than that of the first wiring layer; and
   a first potential supply line supplying a potential to the scanning signal lines via the first driving circuit,
   wherein the first potential supply line extends along the third side from the first side, and
   wherein, in a region along the third side, the first potential supply line goes through the first wiring layer and the second wiring layer.

4. The display device according to claim 3,
wherein a first C circuit block, a first D circuit block, and a first E circuit block,
wherein the first potential supply line goes through the second wiring layer between the first B circuit block and the first C circuit block at a first distance and goes through the second wiring layer between the first D circuit block and the first E circuit block at a second distance, and
wherein the second distance is shorter than the first distance.

5. The display device according to claim 3, further comprising:
a second potential supply line supplying a potential to the scanning signal lines via the second driving circuit,
wherein the first driving circuit includes a first C circuit block,
wherein the first potential supply line goes through the second wiring layer between the first B circuit block and the first C circuit block at a first distance,
wherein the second driving circuit includes a second A circuit block and a second B circuit block,
wherein the second potential supply line goes through the second wiring layer between the second A circuit block and the second B circuit block at a third distance,
wherein the first B circuit block and the second A circuit block are connected to the same scanning signal line, and
wherein the first distance is longer than the third distance.

6. The display device according to claim 3,
wherein, in a region along the first side, the first potential supply line goes through the first wiring layer and does not go through the second wiring layer.

7. A display device comprising:
a substrate includes a display region and a peripheral region that surrounds the display region;
a plurality of video signal lines extended to a first direction in the display region;
a plurality of scanning signal lines extended to a second direction crossing the first direction in the display region;
a first control circuit supplying a video signal and provided in the peripheral region;
a first driving circuit and a second driving circuit supplying a scanning signal and provided in the peripheral region; and
a selection circuit provided between the display region and the first control circuit,
wherein the substrate includes a first side and a second side each extending along the first direction, and a third side and a fourth side each connected to the first side and the second side and opposed to each other,
wherein a length of the second side is longer than a length of the first side,
wherein, when a direction orthogonal to the first direction is referred to as a second direction,
a part of the fourth side extends in a third direction being inclined relative to the first direction and the second direction,
wherein the plurality of scanning signal lines have a first scanning signal line going through a region between the selection circuit and the display region, and
wherein a part of the first scanning signal line extends along the third direction.

8. The display device according to claim 7,
wherein the plurality of scanning signal lines include a second scanning signal line going through the region between the selection circuit and the display region,
wherein, in a plan view, the number of the plurality of video signal lines crossed by the first scanning signal line is equal to the number of the plurality of video signal lines crossed by the second scanning signal line, and
wherein, within the display region, the number of the plurality of video signal lines crossed by the first scanning signal line is different from the number of the plurality of video signal lines crossed by the second scanning signal line.

9. The display device according to claim 7,
wherein the first control circuit is formed in a driver chip outside the display region, and
wherein at least a part of the driver chip extends along a fourth direction being inclined relative to the first direction and the second direction.

10. The display device according to claim 7, further comprising:
a plurality of control wirings in which a control signal controlling the first driving circuit and the second driving circuit is supplied; and
a plurality of first terminals connected to the plurality of control wirings,
wherein the plurality of first terminals are provided along the fourth side.

11. The display device according to claim 10,
wherein the first control circuit is formed in a driver chip to be mounted on the substrate in the peripheral region,
wherein the driver chip extends along the third direction being inclined relative to the first direction and the second direction, and
wherein, in the third direction, a distance from an end on the first side of the driver chip to an outer edge side on the first side of the substrate is longer than a distance from an end on the second side of the driver chip to an outer edge side on the second side of the substrate.

12. The display device according to claim 11,
wherein the plurality of first terminals are arrayed along the third direction.

13. The display device according to claim 11,
wherein the control wirings include a first control wiring and a second control wiring,
wherein the first control wiring is connected to the driver chip, the first driving circuit, and each of the plurality of first terminals,
wherein the second control wiring is connected to the driver chip, the second driving circuit, and each of the plurality of first terminals, and
wherein the second control wiring, in a plan view, overlaps with the driver chip and is connected to the first terminal via a first inspection wiring extending along the third direction.

* * * * *